United States Patent
Inoshita et al.

(10) Patent No.: US 6,724,212 B2
(45) Date of Patent: Apr. 20, 2004

(54) METHOD FOR TESTING A SEMICONDUCTOR INTEGRATED CIRCUIT

(75) Inventors: Chizuru Inoshita, Tokyo (JP); Kazuo Aoki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/205,313

(22) Filed: Jul. 26, 2002

(65) Prior Publication Data

US 2002/0180477 A1 Dec. 5, 2002

Related U.S. Application Data

(62) Division of application No. 09/496,257, filed on Feb. 1, 2000, now Pat. No. 6,446,231.

(30) Foreign Application Priority Data

Jul. 7, 1999 (JP) .......................................... 11-192711

(51) Int. Cl.⁷ ........................ G01R 31/26; G01R 31/28
(52) U.S. Cl. ...................... 324/765; 324/523; 714/724
(58) Field of Search ................................ 324/765, 763, 324/523, 537, 73.1; 714/733–736, 724

(56) References Cited

U.S. PATENT DOCUMENTS

| 6,023,186 | A | | 2/2000 | Kuroda | |
|---|---|---|---|---|---|
| 6,366,108 | B2 | * | 4/2002 | O'Neill et al. | ............... 324/763 |
| 6,407,573 | B1 | * | 6/2002 | Yamaguchi et al. | ........ 324/769 |
| 6,515,500 | B1 | * | 2/2003 | Okuda | ........................ 324/765 |

FOREIGN PATENT DOCUMENTS

| JP | 3-78672 | 4/1991 |
|---|---|---|
| JP | 4-213849 | 8/1992 |
| JP | 8-304514 | 11/1996 |
| JP | 9-211088 | 8/1997 |
| JP | 11-2663 | 1/1999 |

\* cited by examiner

*Primary Examiner*—Evan Pert
*Assistant Examiner*—Paresh Patel
(74) *Attorney, Agent, or Firm*—Leydig, Voit & Mayer, Ltd.

(57) ABSTRACT

In a method of testing a semiconductor integrated circuit, an input signal is applied to the semiconductor integrated circuit. Current passing through the elements of the semiconductor integrated circuit is repeatedly measured while sequentially changing the logical state of the elements. The standard deviation of the currents measured is calculated and a semiconductor integrated circuit is determined to be defective if the standard deviation exceeds a threshold value.

2 Claims, 15 Drawing Sheets

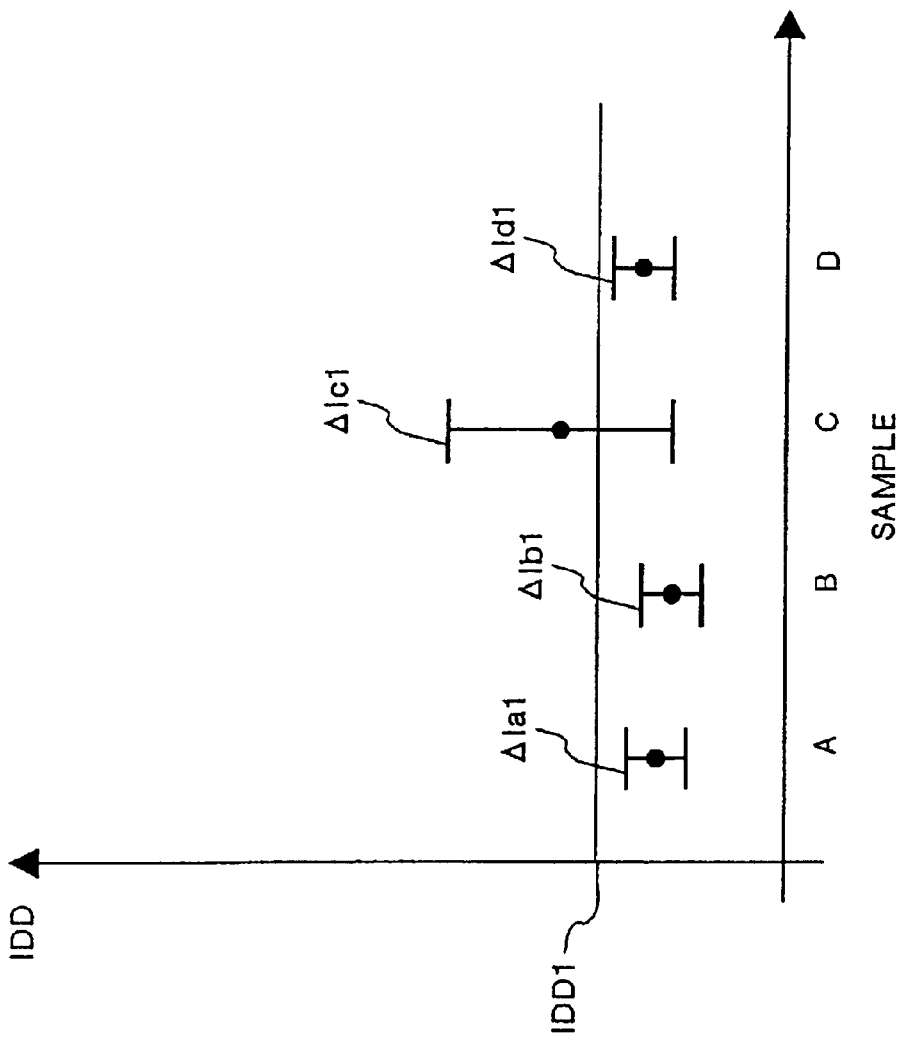

US 6,724,212 B2

METHOD FOR TESTING A SEMICONDUCTOR INTEGRATED CIRCUIT

FIELD OF THE INVENTION

The present invention relates in general to a method for testing a semiconductor integrated circuit in which a current value of a "static" time power source current is measured with the help of an IC tester and whether or not the semiconductor integrated circuit has a defective portion generated in the manufacturing process is determined based on this result. More particularly, the invention relates to a method and an apparatus for testing a semiconductor integrated circuit that has a complementary metal oxide semiconductor element (CMOS) structure.

BACKGROUND OF THE INVENTION

In a manufacturing process of a semiconductor integrated circuit such as an IC, an LSI, etc. having a CMOS structure, it has conventionally determined whether or not the semiconductor integrated circuit contains a defective portion which occurs in the manufacturing process. By doing so the efficiency of the manufacturing process thereafter can be increased.

Determination of whether or not a defective portion is contained in the semiconductor integrated circuit is generally performed using an IC tester. There are various kinds of sorting methods (testing methods) that use an IC tester. For example, there is a method of measuring the current value of the power source current (hereinafter called "a static-time power source current") that flows when the IC is out of operation and determining according to this measured current value whether or not a defective portion is contained in the semiconductor integrated circuit.

In this method where connecting an IC tester to this semiconductor integrated circuit of CMOS structure and measuring the power source current of this circuit, the resulting circuit construction becomes the one (hereinafter called "a CMOS transistor") in which a PMOS transistor and a NMOS transistor are connected in series in the form of a totem pole between the power source and the ground of the tester for measuring the current. Therefore, any one of the PMOS transistor or the NMOS transistor can be made off by fixing each of the respective input terminals of the semiconductor integrated circuit to the power source level or the ground level by means of the tester. It thereby becomes possible to measure the static time power source current. In this case, putting aside a case where the IC has an internal circuit that, even when the IC is kept in the non-operating state, permits a power source current to flow there through, the static-time power source current of the semiconductor integrated circuit usually becomes the sum total of the current values that flow when the CMOS transistors made up on this circuit are being kept "off". However, this sum total value is very small, and in many cases is on the order of $\mu A$ or less.

Generally, in the manufacturing process of a semiconductor, when some drawback occurs in this process, an unnecessary current path is formed in the internal circuit of the semiconductor integrated circuit. In the semiconductor integrated circuit having such an unnecessary current path, even when the CMOS transistor is kept in the non-operating state, the power source current flows into the unnecessary current path that has been formed. The power source current that flows into this unnecessary current path is added to the static-time power source current. For this reason, the current value of the static-time power source current that has been measured when the unnecessary current path has been formed becomes larger than that of the static-time power source current that has been measured when no unnecessary current path has been formed.

Such an unnecessary current path increases the current value of the static-time power source current that flows when the IC is in the non-operating state. Therefore, in addition to increasing the power consumption of the semiconductor integrated circuit, it hinders the normal function and operation thereof even when the semiconductor integrated circuit is in operation. Therefore, the semiconductor integrated circuit that has this unnecessary current path is determined as a defective product.

When performing determination of the defective product of the semiconductor integrated circuit by measurement of the current value of the static-time power source current, ordinarily, it was practiced to fix the internal circuit of the semiconductor integrated circuit to a certain logical state and then perform the measurement once, or it was practiced to change the logical state and perform the measurement a plurality of times. Then, the measured current value is compared with a standard value that is one absolute value, whereby it is determined according to the compared result whether or not the semiconductor integrated circuit was a defective product with an unnecessary current path.

FIG. 11 illustrates a circuit diagram of a conventional static-time power source current measuring circuit with respect to the semiconductor integrated circuit. In FIG. 11, one end of a semiconductor integrated circuit 101 to be measured such as an ASIC is grounded, while the other end thereof is connected to a current measuring instrument 102. A power source 103 is grounded at one end and is connected at the other end to the current measuring instrument 102. A voltage VDD is thereby applied from the power source 103 to the semiconductor integrated circuit 101 through the current measuring instrument 102, and a current is thereby supplied to the circuit 101. On the other hand, a test pattern 105 for setting a logical state is input to the semiconductor integrated circuit 101. It is thereby possible to set the state of connection in the internal circuit of the semiconductor integrated circuit 101 variously. In the state of connection that has been so set by this test pattern, the current measuring instrument 102 measures the current value IDD. And it is determined according to this measured current value IDD whether or not an unnecessary current path exists within the semiconductor integrated circuit 101.

FIGS. 12A and 12B illustrate in block diagram form an example of the internal circuit within the semiconductor integrated circuit 101 and an unnecessary current path therein. FIGS. 12A and 12B illustrate an inverter circuit whose PMOS transistor 113 and NMOS transistor 114 are connected in series to each other. FIG. 12A illustrates a case where, by the test pattern 105 being applied to their gate, the PMOS transistor 113 has been set to an "off" state and the NMOS transistor 114 has been set to an "on" state. FIG. 12B illustrates a case where, by the test pattern 105 being applied to their gate, the PMOS transistor 113 has been set to an "on" state and the NMOS transistor 114 has been set to an "off" state. In FIG. 12A, when an unnecessary current path 115 exists between the power source 103 and the drain of the PMOS transistor 114, it results that an unnecessary current flows between the power source 103 and the ground 104. At this time, the current according to the ability of the NMOS transistor 114 flows between the power source 103 and the ground 104. Similarly, in FIG. 12B, when an unnecessary current path 115 exists between the ground 104 and the drain of the NMOS transistor 114, it results that an unnecessary current flows between the power source 103 and the ground 104. At this time, the current according to the ability of the PMOS transistor 113 flows between the power source 103 and the ground 104.

In the semiconductor integrated circuit of CMOS structure, when each of its respective signals including a clock signal changes, i.e., rises or falls, a pass current and charge and discharge currents of the load capacitor temporarily flow by both the PMOS transistor and the NMOS transistor being made "on". Since this state is temporary, these currents gradually decrease. Then, in a state where each signal has thereafter been fixed, these currents cease to flow. Namely, the logical state of the internal circuit is set as is so by the test pattern that is input to each of the respective input terminals thereof, and the power source current thereof temporarily increases when each signal is changed. Ordinarily, when the active edge of either the rise or the fall of the clock signal is changed, the internal flip flops operate all together, whereby the signal lines that are connected with the flip flops begins to change all together. Therefore, a largest amount of power source current flows. FIG. 13 illustrates a timing chart of the relationship between one clock signal of the test pattern 105 input to the semiconductor integrated circuit 101 and a power source current value IDD. Namely, the FIG. 13 illustrates an example when the internal flip flops work all together by the rise of the clock signal, and the power source current value IDD is temporarily increased. In this case, the time length within one period, during which the logical state of the internal circuit is kept fixed, is a static time (t1) of the semiconductor integrated circuit 101. Ordinarily, the measurement of the static-time power source current is performed at the static time of the semiconductor integrated circuit 101 that succeeds a time (t2) during which the changes in all signals, including the clock signal, that have been input, are completed and one logical state has thereby been set, namely, at the time (t1) in which the logical state of the internal circuit has become stable. In FIG. 13, at the time of P(1) and P(2), the current value IDD of the static-time power source current is measured.

FIG. 14 illustrates a timing chart of a change of the power source current value IDD according to the passage of time that prevails when measurement is made a plurality of times. In FIG. 14, using the test pattern 105, logical setting is done as the test period a plurality of times. In FIG. 14, logical setting is done with j-time periods. Measurement of the current value of the static-time power source current is performed at the static time (t1) after logical setting has been done. It is to be noted that in FIG. 14 illustration is also made together of a standard value IDD1 that is an absolute reference value for determining whether or not the semiconductor integrated circuit 101 contains a defective portion therein, an average value Iave1 of the static-time power source currents that are obtained when no defective CMOS element exists, and a dispersion range ΔTR1 of the static-time power source current values that have been measured from the semiconductor integrated circuit itself and that contain the measurement errors.

As shown in FIG. 14, the current values IDD at the time of P(1) and P(2) are both less than the standard value IDD1, and therefore it is determined that no unnecessary current path exists. However, the current value IDD at the time of P(3) exceeds the standard value IDD1, and therefore it is determined that an unnecessary current path exists in the circuit in this logical setting. Then, the semiconductor integrated circuit 101 having one unnecessary current path is determined as being a defective product.

The series of this test processing is as follows. First, the test pattern 105 works the semiconductor integrated circuit, and the logical state inside is determined (t2). Thereafter, the current value IDD of the static-time (t1) power source current is measured. This current value IDD is compared with the standard value IDD1. In a case where the current value IDD does not exceed the standard value IDD1, the test pattern 105 is further supplied to the semiconductor integrated circuit 101 to thereby determine a logical state thereof. After this determined logical state, the current value IDD of the static-time power source current is measured again. This re-measured current value IDD and the standard value IDD1 are compared with each other. When the current value IDD has exceeded the standard value IDD1 during this repetition of such comparison processing, it is decided, at this point, that an unnecessary current circuit exists in the semiconductor integrated circuit 101. And it is determined that the semiconductor integrated circuit 101 is a defective product, and succeeding measurement and comparison processing are not performed thereafter. On the other hand, when the current value IDD does not exceed the standard value IDD1 even when the measurement and the comparison is performed for the predetermined number of times then the semiconductor integrated circuit 101 is determined to be a non-defective product.

Namely, in this testing method of a semiconductor integrated circuit, if every comparison result is that: IDD<IDD1, it is determined that the semiconductor integrated circuit is a non-defective product. And if equal to or more than one comparative result is that:

$$IDD \geq IDD1,$$

it is determined that the semiconductor integrated circuit is a defective product.

Meanwhile, assuming that "Idd(tr)" represents the current value of the static-time power source current of one transistor; "ΔIdd(tr)" represents the dispersion of this current value; and the semiconductor integrated circuit 101 as a whole has an N number of transistors, the current value IDD (static) of the static-time power source current of the entire semiconductor integrated circuit 101 which does not have unnecessary current path can be expressed as follows.

$$IDD(\text{static}) = Idd(tr) \cdot N + \Delta Idd(tr) \cdot N$$

At this time, the current value IDD (measure) of the measured static-time power source current can be expressed, under the assumption that "ΔIdd (measure)" represents the measurement error, as follows.

$$IDD(\text{measure}) = IDD(\text{static}) + \Delta Idd(\text{measure})$$

Also, assuming that "ΔIdd (fault)" represents a portion of change in current due to the unnecessary current path, the current value IDD (fault) of the static-time power source current of the entire semiconductor integrated circuit 101 which has an unnecessary current path is expressed as follows.

$$IDD(\text{fault}) = IDD(\text{static}) + \Delta Idd(\text{fault})$$

At this time, when comparing the measurement error ΔIdd (measure), and the portion of change in current ΔIdd (fault) due to the unnecessary current path, of the semiconductor integrated circuit 101, if the scale of the semiconductor integrated circuit 101 is small, the following equation holds true.

$$\Delta Idd(\text{fault}) \gg \Delta Idd(\text{measure})$$

Therefore, it is possible to clearly distinguish between the portion of change in current ΔIdd (fault) and the measurement error ΔIdd (measure). And therefore, $$IDD(\text{measure})(=IDD(\text{static})+\Delta Idd(\text{measure}))<<IDD(\text{fault})(=IDD(\text{static})+\Delta Idd(\text{fault}))$$

Here, FIG. 15 illustrates a graph of an example of the dispersion range of the current values IDD of the static-time power source current. In FIG. 15, it can be seen that when the average value (that is indicated by the round black dot "●") of the current values IDD of the static-time power source current is small, the dispersion range of the current values is also small. For example, each of the average values of samples A, B, and D are each below the standard value IDD1, and are small. In addition, the dispersion ranges ΔIa1, ΔIb1, and ΔId1 also are each small. In contrast to this, the average value of a sample C exceeds the standard value IDD1, and the dispersion range ΔIc1 is also large.

Accordingly, when each of the current values Idd(tr)·N of the static-time power source current are small, each of the values of the dispersion ΔIdd(tr)·N in the semiconductor integrated circuit itself also becomes small. Therefore, by setting the standard value IDD1 as one value that satisfies the equation:

$$IDD(\text{static})(\approx Idd(tr)\cdot N)<IDD(\text{measure})<IDD1<<IDD(\text{fault})$$

and comparing the current value IDD (measure) of the static-time power source current to the standard value IDD1, it is possible to determine whether an unnecessary current path is present, i.e., whether the semiconductor integrated circuit is a defective product.

However, with technical progress that has been made in recent years, it has, in actuality, become possible to manufacture more and more speedy and highly integrated and larger-in-scale semiconductor integrated circuits. In these speedy and highly integrated and larger-in-scale semiconductor integrated circuits, the current values Idd(tr) of the static-time power source current between the respective transistors constituting the semiconductor integrated circuit, and the dispersion ΔIdd(tr) of these current values have become large. Further, the dispersion ΔIdd(IC) between the respective semiconductor integrated circuits due to the process parameters used in manufacturing the semi conductor IC's also has become large. This is accompanied by the dispersion ΔIdd(IC) between the semiconductor integrated circuits and the portion of change in current ΔIdd (fault) due to the unnecessary current path becoming almost equal to each other, or to the dispersion ΔIdd(IC) exceeding the portion of change in current ΔIdd (fault). Therefore, in the conventional testing method of a semiconductor integrated circuit, distinguishing between the dispersion and the portion of change in current becomes difficult, and there is a problem that it is not possible to accurately determine whether the semiconductor integrated circuit is a defective product.

Namely, the static-time power source current IDD (static) (=Idd(tr)·N+ΔIdd(tr)·N) itself in the semiconductor integrated circuit which does not have unnecessary current path is largely dispersed between the semiconductor integrated circuits. Therefore, even in the case of the static-time power source current IDD (static) free from any unnecessary current path, when it is compared with the static-time power source current IDD (fault) in another semiconductor integrated circuit which has an unnecessary current path, there occurs a case wherein:

$$IDD(\text{static}) \geq IDD(\text{fault})$$

In this case, even when using the standard value IDD1 that is one absolute reference value, it is impossible to detect reliably the presence or the absence of an unnecessary current path. Therefore, there is a problem that it is resultantly difficult to perform a determination of whether or not the semiconductor integrated circuit is a defective product.

SUMMARY OF THE INVENTION

It is an object of the present invention to provide a method for testing a semiconductor integrated circuit which enables the reliable detection of the drawback that has occurred in the manufacturing process of a semiconductor by measuring the current value of the static-time power source current, even in the case of a semiconductor integrated circuit wherein the current values of the static-time power source current of each of the respective elements constituting the semiconductor integrated circuit, and the dispersion of these current values, are large; and further the dispersion between the semiconductor integrated circuits due to the process parameters is large.

In a testing method of semiconductor integrated circuit, according to the first aspect of this invention, a current value of a static-time power source current passing through a plurality of elements that constitute a semiconductor integrated circuit is measured for a plurality of times while sequentially changing and setting a logical state of the plurality of elements. Further, maximum and minimum values are extracted from the plurality of the current values that have been measured. Further, it is determined that the semiconductor integrated circuit is a defective product when the difference between the maximum and the minimum values exceeds a predetermined value.

In a testing method of semiconductor integrated circuit according to the second aspect of this invention, a current value of a static-time power source current passing through a plurality of elements that constitute a semiconductor integrated circuit is measured for a plurality of times while changing and setting a logical state of the plurality of elements. Further, a difference between the successively measured current values with respect to a plurality of current values that have been measured is calculated. Further, it is determined that the semiconductor integrated circuit is a defective product when at least one of the calculated difference exceeds a predetermined value.

In a testing method of semiconductor integrated circuit according to the third aspect of this invention, a current value of a static-time power source current passing through a plurality of elements that constitute a semiconductor integrated circuit is measured in a first measuring step while changing and setting a logical state of the plurality of elements. Further, a current value of the static-time power source current passing through the plurality of elements that constitute the semiconductor integrated circuit is measured in a second measuring step while changing and setting a logical state of the plurality of elements set in the first measuring step. Further, a difference between the current values measured in the first and second measuring steps is calculated. Further, it is determined that the semiconductor integrated circuit is a defective product when the calculated difference exceeds a predetermined value. Further, when it is determined that the semiconductor integrated circuit is a non-defective product then the current value obtained in the second measuring step is replaced with the current value obtained in the first measuring step and the second measuring step, the calculation of difference and the determination of defectiveness is repeated for a predetermined number of times.

In a testing method of semiconductor integrated circuit according to the fourth aspect of this invention, a current value of a static-time power source current passing through a plurality of elements that constitute a semiconductor integrated circuit is measured for a plurality of times while sequentially changing and setting a logical state of the plurality of elements. Further, a standard deviation of the plurality of the measured current values is calculated. Further, it is determined that the semiconductor integrated circuit is a defective product when the standard deviation exceeds a predetermined value.

In a testing method of semiconductor integrated circuit according to the fifth aspect of this invention, a current value of a static-time power source current passing through a plurality of elements that constitute a semiconductor integrated circuit is measured for a plurality of times while sequentially changing and setting a logical state of the plurality of elements. Further, maximum and minimum values are extracted from the measured current values. Further, an average of the measured current values is calculated. Further, it is determined that the semiconductor integrated circuit is a defective product when a difference between the average and the maximum value and a difference between the average and the minimum value exceeds a predetermined value.

In a testing method of semiconductor integrated circuit according to the sixth aspect of this invention, a logical state of the elements is set to an initial state, the current value of a static-time power source current is measured, when the difference between the current value at the time of initial logical state and the current value after re-setting is greater than a predetermined value then it is determined that the semiconductor integrated circuit is a non-defective product.

In an apparatus for testing a semiconductor integrated circuit, according to the seventh aspect of this invention, a measuring unit measures a current value of a static-time power source current passing through a plurality of elements that constitute a semiconductor integrated circuit for a plurality of times while sequentially changing and setting a logical state of the plurality of elements. Further, an extracting unit extracts maximum and minimum values from the plurality of the current values that have been measured. Further, a determining unit determines that the semiconductor integrated circuit is a defective product when the difference between the maximum and the minimum values exceeds a predetermined value.

Other objects and features of this invention will become apparent from the following description with reference to the accompanying drawings.

BRIEF DESCRIPTION OF THE DRAWINGS

FIG. 15 illustrates a graph of the conventional results of the test that has been performed using the conventional testing method of a semiconductor integrated circuit.

DESCRIPTION OF THE PREFERRED EMBODIMENTS

Preferred embodiments of a testing method of a semiconductor integrated circuit according to the present invention will now be explained with reference to the accompanying drawings.

Figure 1:
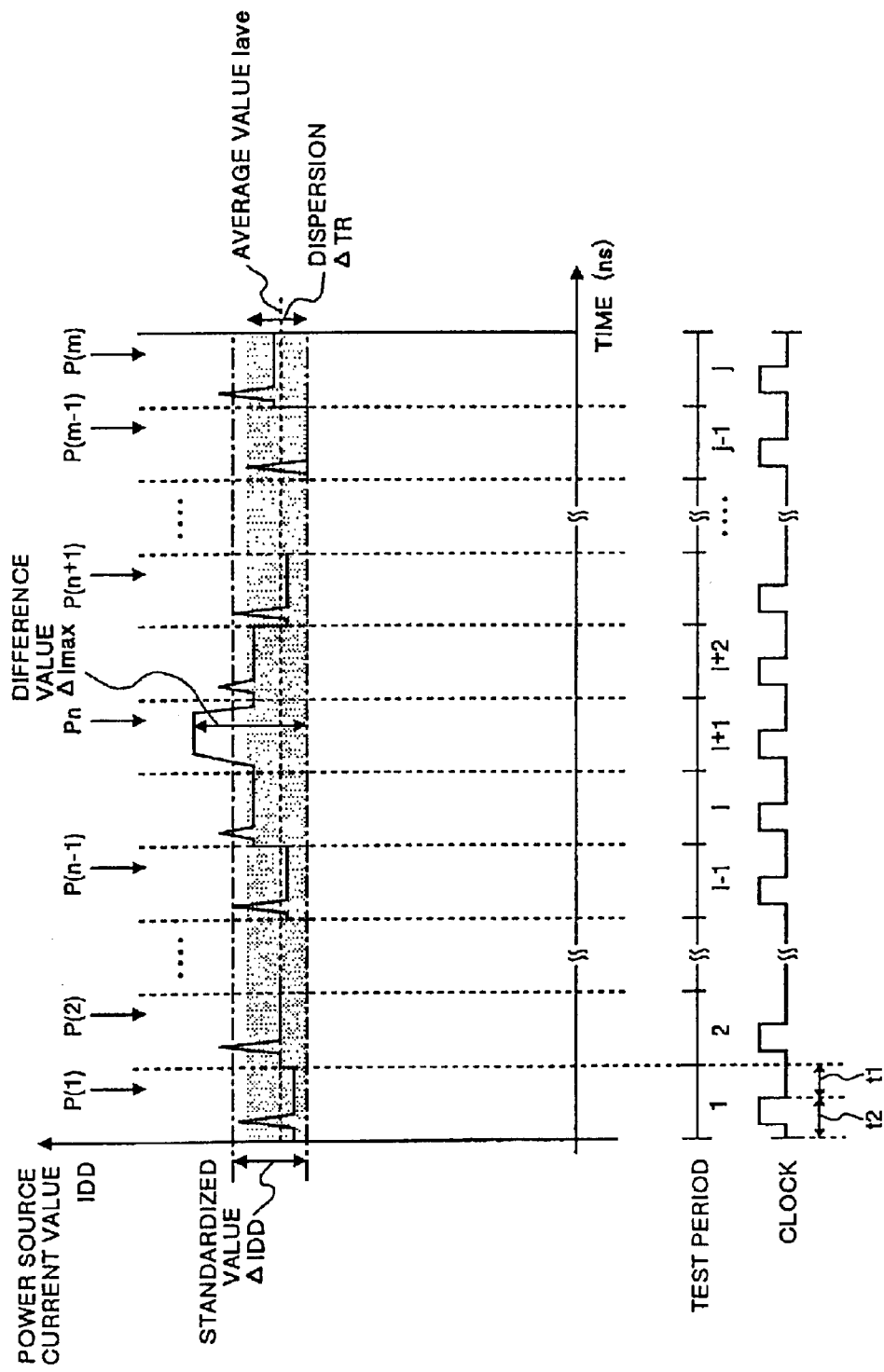
FIG. 1 illustrates a timing chart of a static-time power source current that is detected using a testing method of a semiconductor integrated circuit according to a first embodiment of the present invention.
Figure 2:
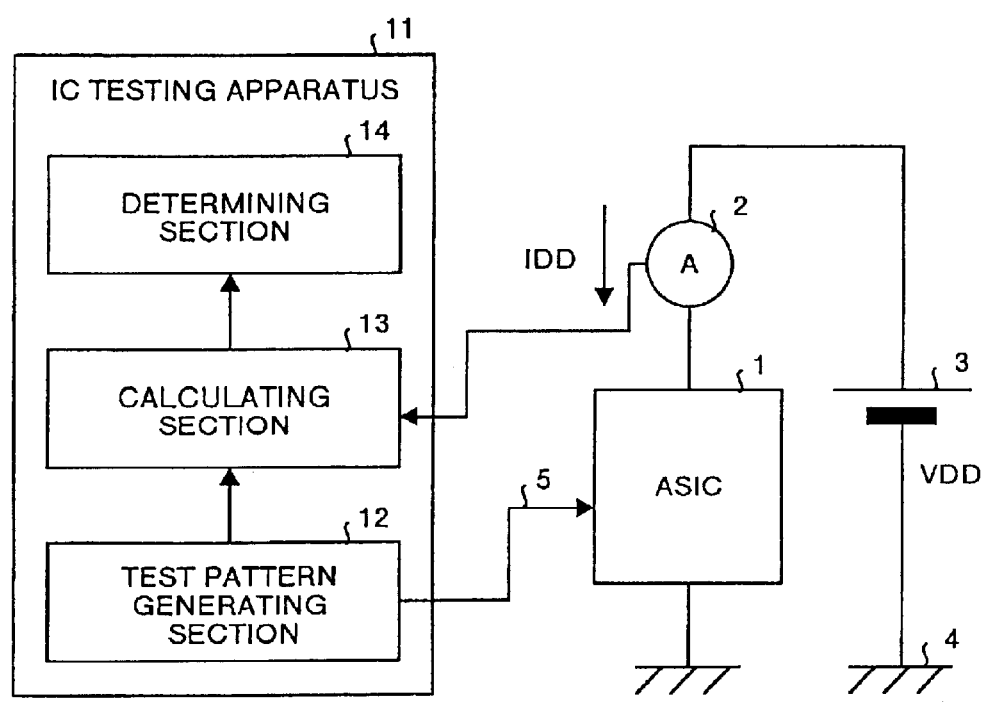
FIG. 2 illustrates in block diagram from the construction of an apparatus for executing the testing method of a semiconductor integrated circuit according to the first embodiment of the present invention.

To begin with, a first embodiment of the present invention will hereafter be explained. FIG. 1 illustrates a timing chart of the static-time power source current that is detected using a testing method of a semiconductor integrated circuit according to the first embodiment of the present invention. FIG. 2 illustrates in block diagram form the construction of an entire apparatus for executing the testing method of a semiconductor integrated circuit according to the first embodiment of the present invention. In FIG. 2, one end of a semiconductor integrated circuit 1 to be measured, such as an ASIC, is grounded, and the other end thereof is connected to a current measuring instrument 2. A power source 3 is grounded at one end and is connected at the other end to the current measuring instrument 2. One terminal of the power source 3 is connected to the ground while the other terminal is connected to the current measuring instrument 2. Thus, a voltage VDD and a current are supplied to the semiconductor integrated circuit 1 through the current measuring instrument 2.

Figure 12A:
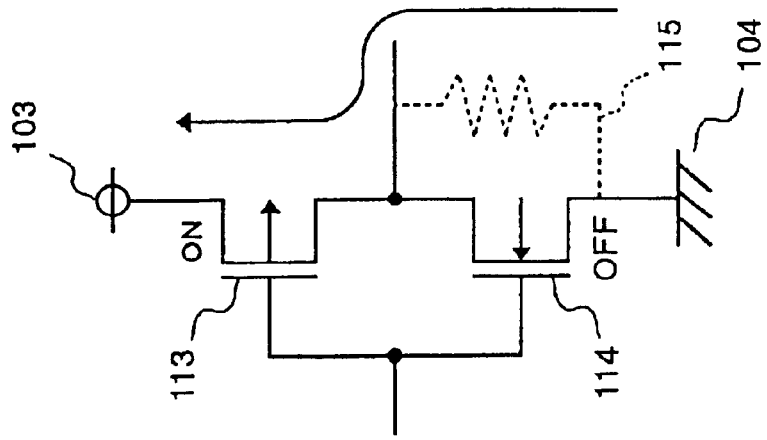
FIGS. 12A and 12B illustrate in block diagram form a concrete example of a state of internal circuit of a semiconductor integrated circuit and an unnecessary current path therein.
Figure 12B:
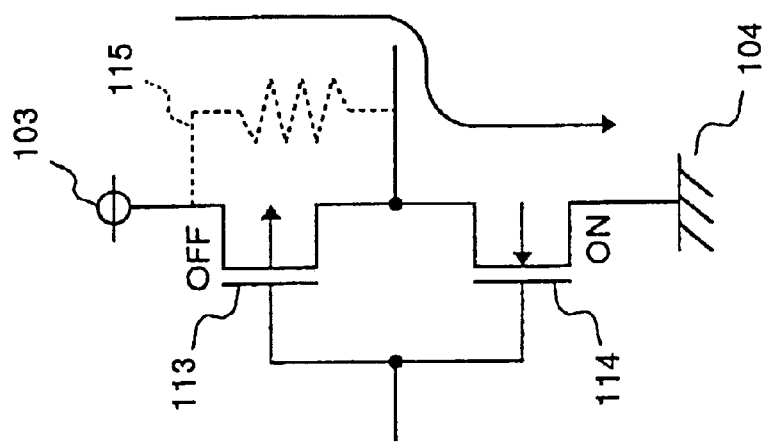
Figure 13:
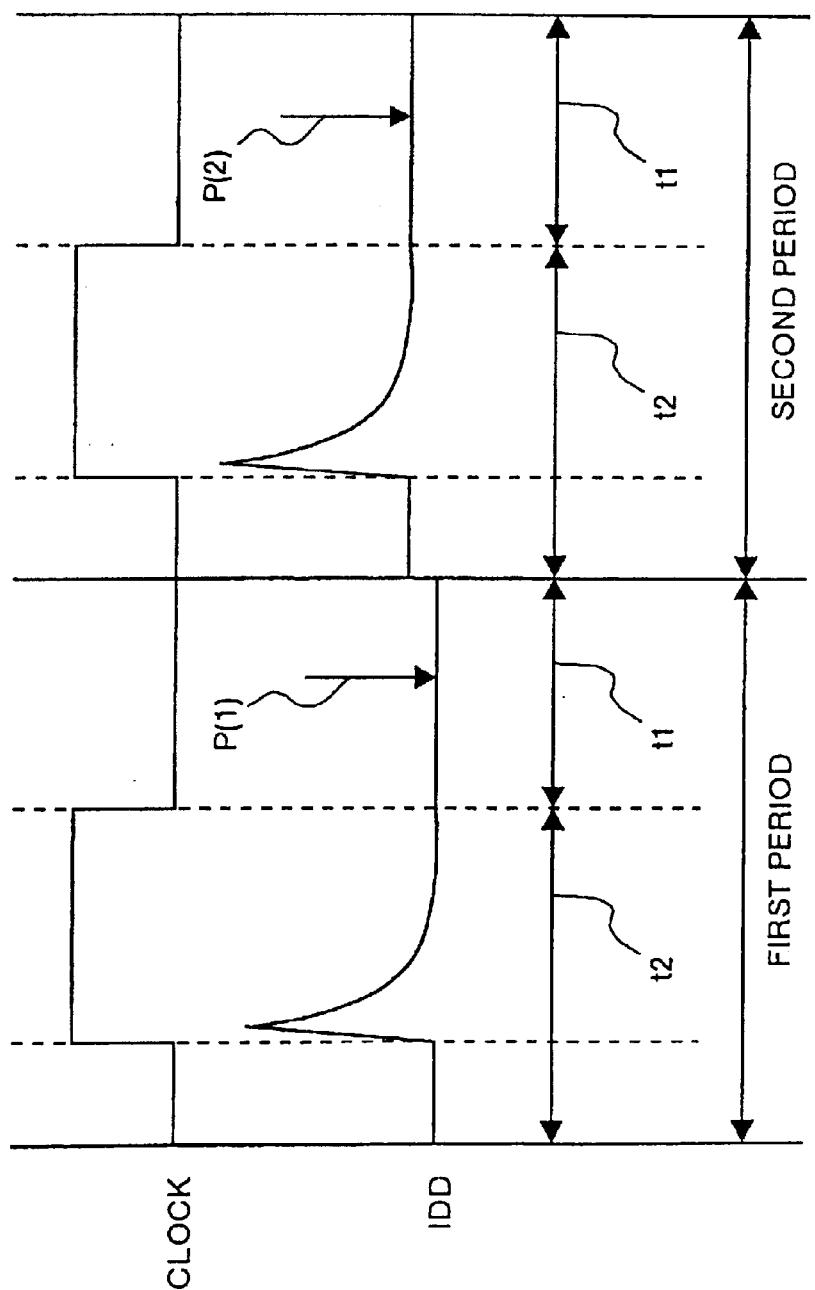
FIG. 13 illustrates a timing chart of the relationship among a clock of a test pattern, a test period, and a power source current.
Figure 14:
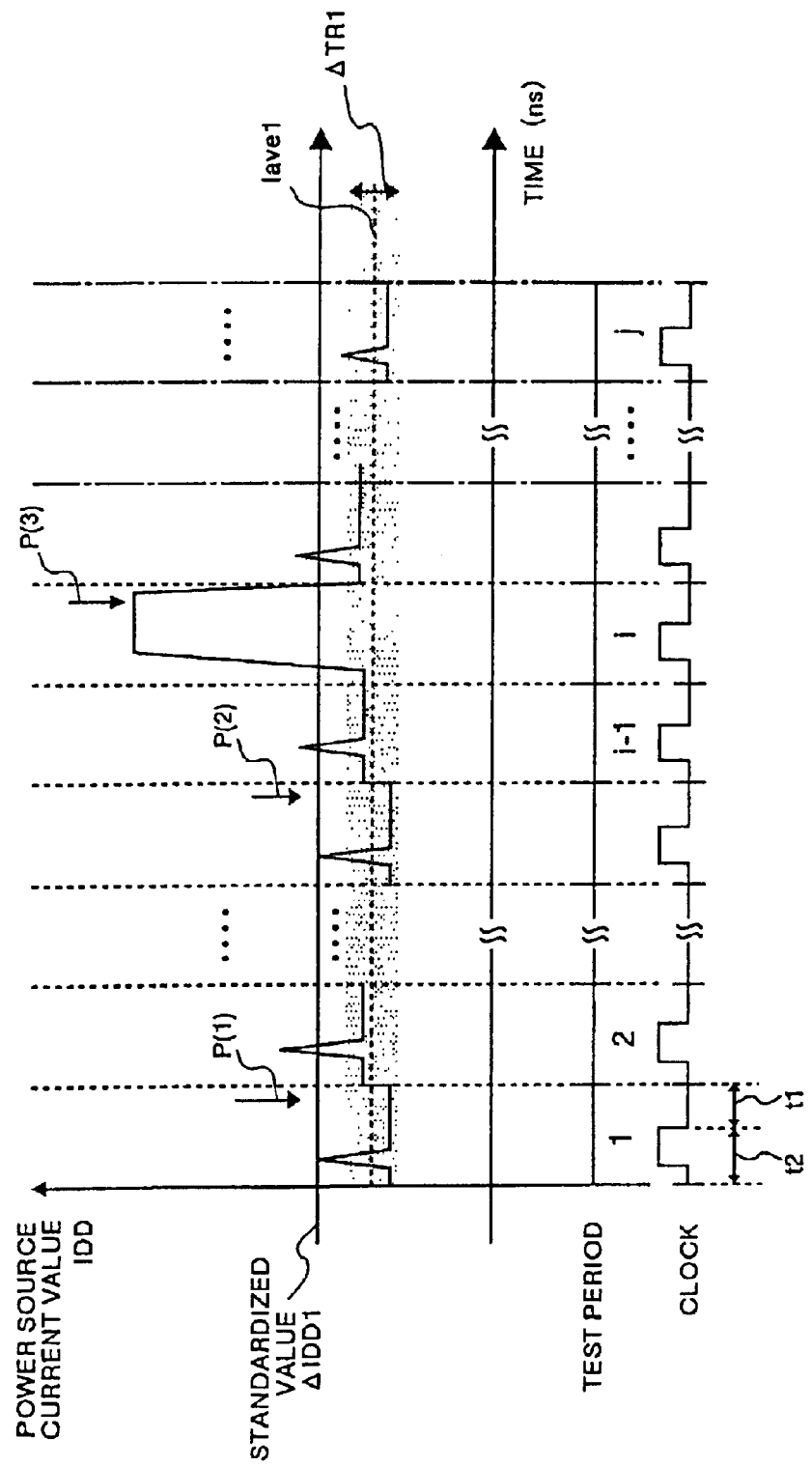
FIG. 14 illustrates a timing chart of a static-time power source current that is detected using a conventional testing method of a semiconductor integrated circuit.

On the other hand, an IC testing apparatus 11 is connected to the semiconductor integrated circuit 1 and the current measuring instrument 2. The IC testing apparatus 11 has a test pattern generating section 12, a calculating section 13 and a determining section 14. The test pattern generating section 12 is connected to the semiconductor integrated circuit 1, and it inputs a test pattern 5 to set a logical state to the semiconductor integrated circuit 1. As a result, it becomes possible to set the state of connection in an internal circuit within the semiconductor integrated circuit 1 variously. In the state of connection that has been so set by this test pattern 5, the calculating section 13 measures a current value IDD from the current measuring instrument 2 in synchronism with a clock of the test pattern 5. The calculating section 13 performs the calculation processing described later based on this measured current value IDD. Then, the determining section 14 determines whether or not an unnecessary current circuit such as that illustrated in FIG. 12 exists within the semiconductor integrated circuit 1. Thus, as a result, the determining section 14 determines whether or not the semiconductor integrated circuit 1 is a defective product.

As shown in FIG. 1, the test pattern 5 is input into the respective input terminals of the semiconductor integrated circuit 1. The logical state of a desired element constituting the internal circuit of the semiconductor integrated circuit 1 is determined when the clock signal, one of the signals constituting this test pattern, rises. When the logical state of the internal circuit of the semiconductor integrated circuit 1 is being changed (t2) according to a change of each of these signal lines, the semiconductor integrated circuit 1 is in an operating condition. When the changes of all the signals have been completed and the logical state of the Internal circuit is kept fixed (t1), the semiconductor integrated circuit 1 is in the non-operating state, i.e., static-time. The value of the power source current IDD at this static-time is detected by the current measuring instrument 2.

The test period of the test pattern is determined by the clock signal contained therein, and, in FIG. 1, the test pattern has j test periods (j=1, 2, 3, . . . , i, i+1, 1+2, . . . j−1, j). Accordingly, during each test period, a respective different logical state is set.

The measurement of the current value IDD of the static-time power source current is performed when, as described above, changes of all the signals have been completed with the result that the logical state of the internal circuit has thereby become fixed (t1). In FIG. 1, the measurement is performed m times (m=1, 2, 3, . . . , n−1, n, n+1, . . . , m−1, m). This measurement is not necessary every test period, and may be performed to measure the current value IDD of the static-time power source current with respect to an optional test period. It is to be noted that while the static-time power source current is measured m times from the time P(1) to the time P(m), it is assumed that the current values at the respective times are represented by I(1)~I(m).

In this first embodiment, a maximum current value and a minimum current value are extracted from the current values I(1)~I(m) that have been measured m times. The absolute value of a difference ΔImax between the thus-extracted maximum current value IDDmax and minimum current value IDDmin, namely, $|\Delta Imax|=IDDmax-IDDmin$ is determined. This absolute value of the difference ΔImax is compared with a standard value ΔIDD that is within a predetermined current value range. If $|\Delta Imax| \leq \Delta IDD,$ the semiconductor integrated circuit 1 to be tested is determined as being a non-defective product. If $|\Delta Imax| > \Delta IDD,$ the semiconductor integrated circuit 1 to be tested is determined to be a defective product. It is to be noted that the standard value ΔIDD is not an absolute reference value but is a value of a preset range.

Accordingly, since the maximum current value IDDmax in the timing chart illustrated in FIG. 1 is a current value I(n) that has been measured at the time of P(n) while the minimum current value IDDmin is a current value I(m−1) that has been measured at the time of P(m−1), the absolute value of the difference ΔImax is expressed as follows.

$|\Delta Imax|=I(n)-I(m-1)$

This value is compared with the standard value ΔIDD, whereby it is determined whether or not the semiconductor integrated circuit 1 is a defective product. It is to be noted that the dispersion ΔTR of the measured current values, containing error, of the semiconductor integrated circuit 1 itself, and the average value Iave are indicated in FIG. 1.

Figure 3:
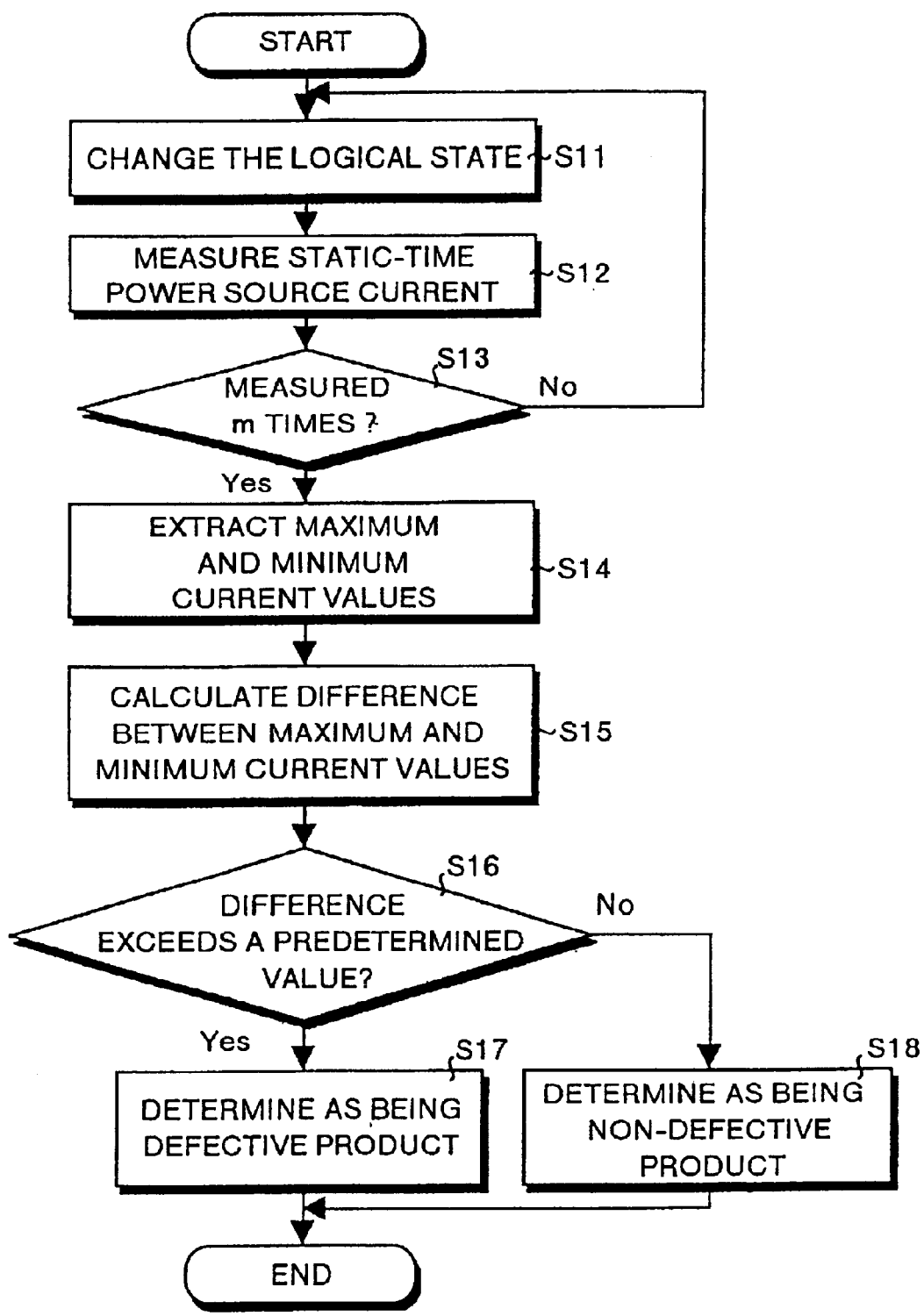
FIG. 3 illustrates a flow chart of a procedure of performing test processing with the use of the testing method of a semiconductor integrated circuit according to the first embodiment of the present invention.

Here, a testing procedure of testing a semiconductor integrated circuit will be explained with reference to a flow chart illustrated in FIG. 3. As shown in FIG. 3, by inputting the test pattern 5 containing a clock signal into the semiconductor integrated circuit 1 from the test pattern generating section 12 the setting of the logical state of the internal circuit of the semiconductor integrated circuit 1 (step S11) is changed. Then, the current value IDD of the static-time power source current is measured at the static time within one test period (step S12). Thereafter, it is determined whether or not the measurement of the current value IDD has been performed m times (step S13). When the measurement is not performed m times (step S13, "NO"), the processing is shifted to the step S11, whereby the above-described change of setting of the logical state and measurement of the current value of the static-time power source current are repeatedly performed.

On the other hand, when the measurement of the current value IDD has been performed m times (step S13, "YES"), the maximum current value Imax and the minimum current value Imin are extracted from among the m-time measured current values IDD (I(1) to I(m)) (step S14). Then, the difference ΔImax between the thus-extracted maximum current value Imax and minimum current value Imin is calculated (step S15). Because this difference Imax is obtained by subtracting the minimum current value Imin from the maximum current value Imax this difference Imax is always positive. Therefore, an absolute value of this difference is not calculated.

Thereafter, it is determined whether or not the thus-calculated difference ΔImax has exceeded the predetermined standard value ΔIDD (step S16). When the difference ΔImax exceeds the standard value ΔIDD (step S16, "YES") then it is determined that an unnecessary current path exists and, therefore, the semiconductor integrated circuit 1 is considered as a defective product (step S17). On the contrary, when the difference ΔImax does not exceed the standard value ΔIDD (step S16, "NO") then it is determined that an unnecessary current path does not exist and, therefore, the semiconductor integrated circuit 1 is considered as a non-defective product (step S18). Then, this process ends.

Figure 4:
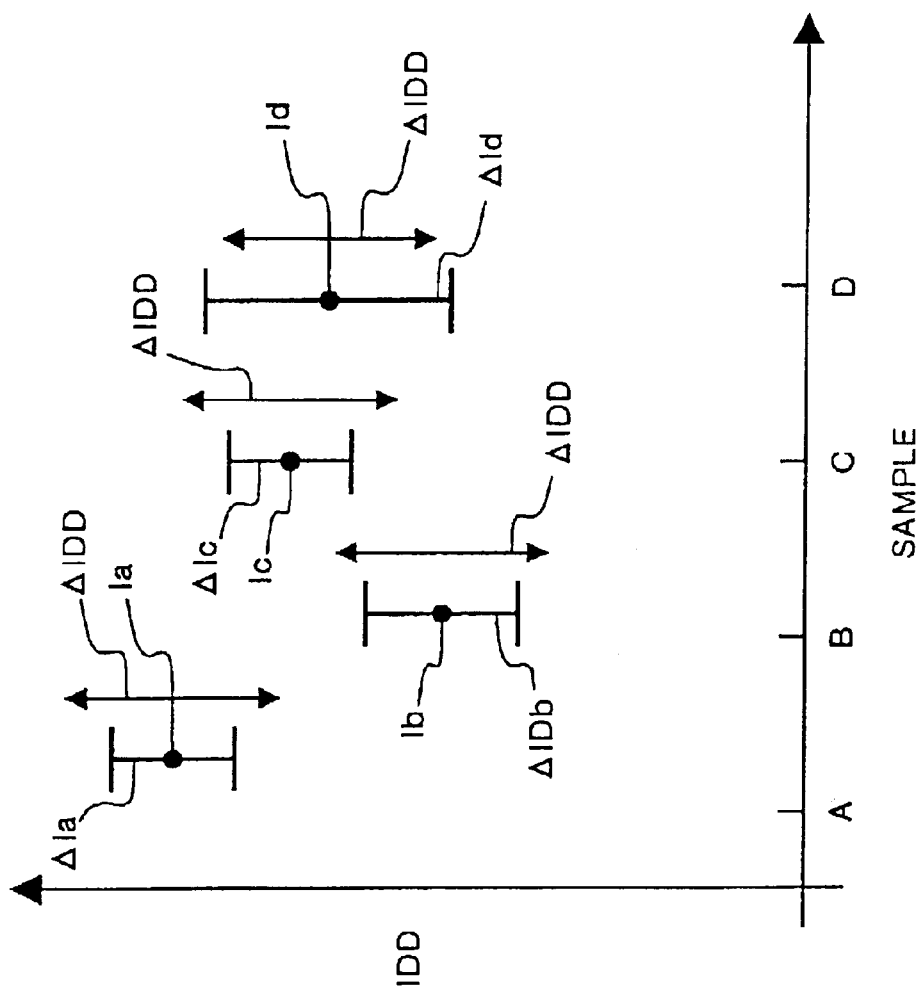
FIG. 4 illustrates a graph of the results that have been obtained when having applied the testing method of a semiconductor integrated circuit according to the first embodiment of the present invention to a plurality of semiconductor integrated circuits.

FIG. 4 illustrates a graph of the contents of the results that have been obtained when having executed this testing procedure with respect to a plurality of semiconductor integrated circuits. And this figure shows the average values Ia to Id of the current values IDD with respect to the respective semiconductor integrated circuits (samples) A~D, and the dispersions ΔIa~ΔId of these current values. In FIG. 4, regarding the samples A~C, the differences Imax, i.e., the dispersions ΔIa~ΔIc are less than the standard value ΔIDD, and therefore these samples are determined as being non-defective products. However, regarding the sample D, the difference Imax, i.e., the dispersion ΔId is greater than the standard value ΔIDD, and therefore these samples are determined as being defective products.

According to the first embodiment, a defect generated during the manufacturing process of a semiconductor can be detected when the current value Idd(tr) of the static-time power source current of one element such as a transistor that constitutes the semiconductor integrated circuit, and the dispersion ΔIdd(tr) of these current values Idd(tr) are large. In addition, a defect generated during the manufacturing process of a semiconductor can be detected by use of the current values IDD of the static-time power source current even in cases where the dispersion ΔIdd(IC) between the semiconductor integrated circuits due to the process parameters used in the manufacturing process of a semiconductor becomes large and the dispersion ΔIdd(IC) between the semiconductor integrated circuits is almost equal to the change of current ΔIdd (fault) due to the defect that has occurred during the manufacturing process of a semiconductor, or ΔIdd(IC) is larger than the current ΔIdd (fault) so that it is difficult to distinguish between this dispersion and the portion of change in current due to the unnecessary current path. Therefore, according the first embodiment, it is resultantly possible to reliably determine whether or not the semiconductor integrated circuit is a defective product.

Further, according to the first embodiment, even in a case where the current value IDD (static)(=Idd(tr)·N+ΔIdd(tr)·N) of the static-time power source current itself is largely dispersed between the semiconductor integrated circuits, it is possible to reliably detect the drawback that has occurred in the manufacturing process of a semiconductor. Therefore, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Therefore, according to the first embodiment, it is resultantly possible to simplify the test program or the test vector.

Next, a second embodiment will be explained. In the first embodiment, the difference ΔImax between the maximum current value Imax and the minimum current value Imin of the m-time measured current values IDD is compared with the predetermined standard value ΔIDD, and it is determined whether or not the semiconductor integrated circuit is a defective product according to the result of this comparison. However, in the second embodiment, a difference between continuous values of the m successive measured current values IDD is compared with a standard value ΔIDD2 having a predetermined range, and whether or not the semiconductor integrated circuit is a defective product is determined according to the result of this comparison.

Figure 5:
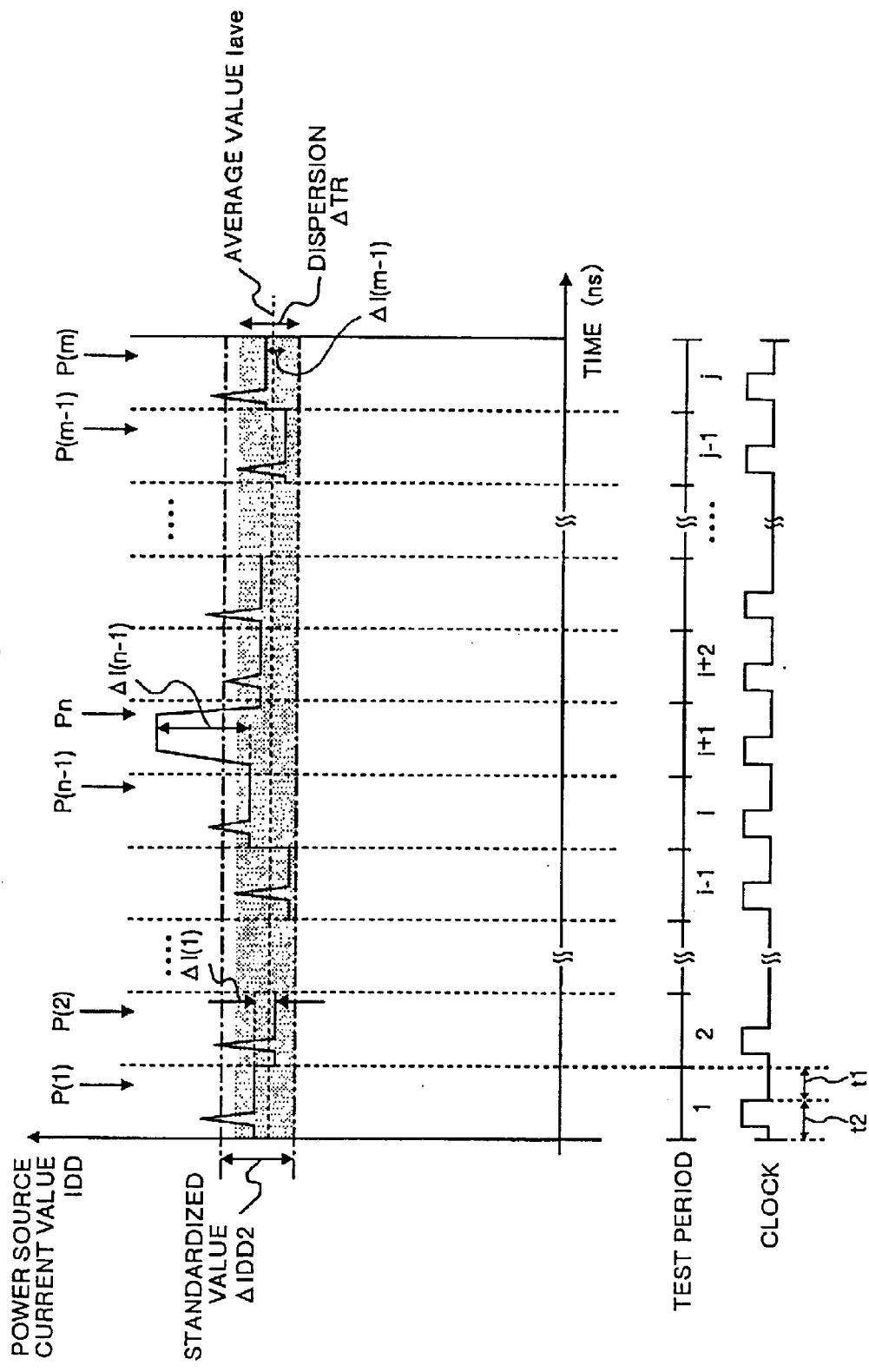
FIG. 5 illustrates a timing chart of a static-time power source current that is detected using the testing method of a semiconductor integrated circuit according to a second embodiment of the present invention.

FIG. 5 illustrates a timing chart of the static-time power source current that is detected using a testing method of a semiconductor integrated circuit according to the second embodiment of the present invention. The test of the semiconductor integrated circuit according to the second embodiment is performed by using the apparatus illustrated in FIG. 2. All of the clock supplied by the test pattern 5, the times of the test periods, the measuring times of m times, and the measuring time of P(1) to P(m) shown in FIG. 5 are the same as those in the first embodiment. Namely, the measurement results of the current values IDD of the static-time power source current are quite the same as those in the first embodiment.

In the second embodiment, the absolute value of the difference ΔI between two successively measured current values is calculated with respect to these measurement results of the current values IDD. For example, the absolute value of the difference ΔI(n) between the (n)th current value I(n) and the (n+1)th current value I(n+1) is calculated as follows:

$$|\Delta I(n)|=I(n)-I(n+1).$$

This absolute value of the difference ΔI is then compared with the standard value ΔIDD2 having a predetermined range. And if $$|\Delta I|\leq\Delta IDD2,$$

it is determined that the semiconductor integrated circuit 1 to be tested is a non-defective product. And if $$|\Delta I|>\Delta IDD2,$$

it is determined that the semiconductor integrated circuit 1 to be tested is a defective product. It is to be noted that, as in the case of the first embodiment, the standard value ΔIDD2 is not an absolute reference value but is a value that indicates a magnitude within a predetermined range.

Thus, according to the measurement results illustrated in FIG. 5, since the absolute value of the difference ΔI(n−1) exceeds the standard value ΔIDD2, it is determined that this semiconductor integrated circuit is a defective product. Namely, when a semiconductor integrated circuit has even one absolute value of the difference ΔI that is greater than the standard value ΔIDD2 then this semiconductor integrated circuit is determined as being a defective product.

Figure 6:
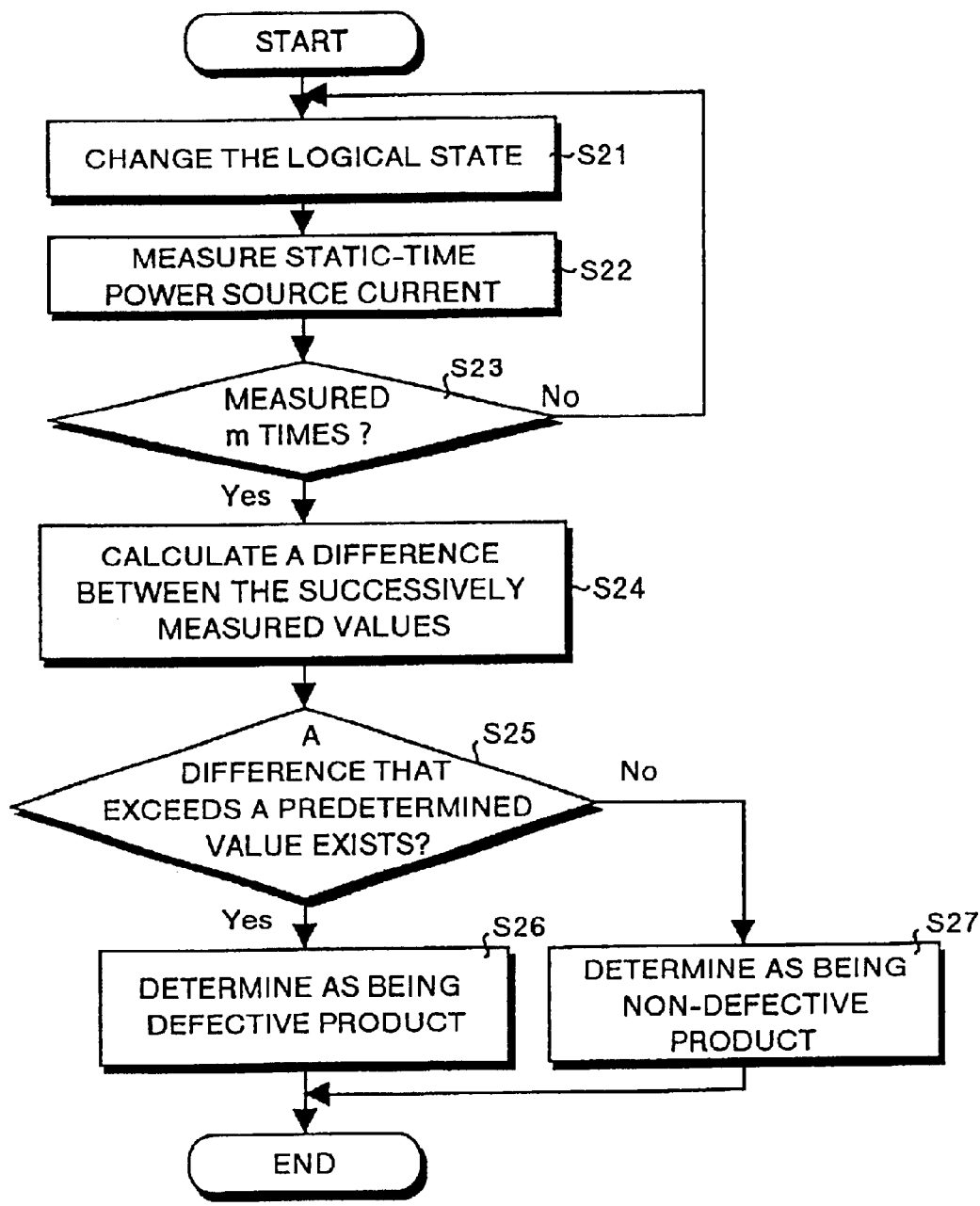
FIG. 6 illustrates a flow chart of a procedure of performing test processing with the use of the testing method of a semiconductor integrated circuit according to the second embodiment of the present invention.

Here, the testing procedure of testing a semiconductor integrated circuit according to the second embodiment will be explained with reference to a flow chart illustrated in FIG. 6. As shown in FIG. 6, by inputting the test pattern 5 containing a clock signal into the semiconductor integrated circuit 1 from the test pattern generation section 12 the setting of the logical state of the internal circuit of the semiconductor integrated circuit 1 (step S21) is changed. Then, the current value IDD of the static-time power source current is measured at the static time within one test period (step S22). Thereafter, it is determined whether or not the measurement of the current value IDD has been performed m times (step S23). When the measurement is not performed m times (step S23, "NO"), the processing shifts to the step S21, whereby the above-described change of setting of the logical state and measurement of the current value of the static-time power source current are repeatedly performed.

On the other hand, when the measurement of the current value IDD has been performed m times (step S23, "YES"), the absolute value of the difference ΔI between two successive current values IDD is calculated with respect to the m-time measured current values IDD (I(1) to I(m)) (step S24). Because this difference ΔI is sometimes negative, it is necessary to calculate the absolute value.

Thereafter, it is determined whether or not the thus-calculated difference ΔI has exceeded the predetermined standard value ΔIDD2 (step S25). When the difference ΔI exceeds the standard value ΔIDD2 (step S25, "YES") then it is determined that an unnecessary current path exists and, therefore, the semiconductor integrated circuit 1 is considered as a defective product (step S26). When the difference ΔI does not exceed the standard value ΔIDD2 (step S25, "NO") then it is determined that an unnecessary current path does not exist and, therefore, the semiconductor integrated circuit 1 is considered as a non-defective product (step S27). Then, this process ends.

According to the second embodiment, in the same manner as the first embodiment, a defect generated during the manufacturing process of a semiconductor integrated circuit can be detected when the current values Idd(tr) of the static-time power source current for one element, such as a transistor that constitutes the semiconductor integrated circuit, and the dispersion ΔIdd(tr) of these current values Idd(tr) are large. In addition, a defect generated during the manufacturing process of a semiconductor integrated circuit can be detected by use of the current values IDD of the static-time power source current even when the dispersion ΔIdd(IC) between the semiconductor integrated circuits due to processing parameters used in the manufacturing process of the semiconductor integrated circuit become large and the dispersion ΔIdd(IC) between the semiconductor integrated circuits is almost equal to the change of current ΔIdd (fault) due to a defect in a semiconductor integrated circuit, or ΔIdd(IC) is larger than the current ΔIdd (fault), so that it is difficult to distinguish between this dispersion and the change in current due to the unnecessary current path. Therefore, according the second embodiment, it is possible to reliably determine whether the semiconductor integrated circuit is a defective product.

Further, according to the second embodiment, even in a case where the current value IDD (static)(=Idd(tr)·N+ΔIdd (tr)·N) of the static-time power source current itself is largely dispersed between the semiconductor integrated circuits, it is possible to reliably detect the drawback that has occurred in the manufacturing process of a semiconductor. Therefore, according to the second embodiment it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Therefore, according to the second embodiment, it is resultantly possible to simplify the test program or the test vector.

Next, a third embodiment will be explained. In the second embodiment, a difference between continuous values of the m successive measured current values IDD is compared with a standard value ΔIDD2 having a predetermined range, and whether or not the semiconductor integrated circuit is a defective product is determined according to the result of this comparison. However, in the third embodiment, the current value IDD is measured and at the same time an absolute value of the difference ΔI is calculated, and when the absolute value of the difference ΔI exceeds the standard value ΔIDD2 it is determined that the semiconductor integrated circuit to be tested is a defective product. When a semiconductor integrated circuit is determined as defective in this way then the succeeding measurements or processing is stopped.

The test of the semiconductor integrated circuit according to the third embodiment of the present invention is performed by using the apparatus illustrated in FIG. 2. In the same way as the second embodiment, the calculating section 13 calculates the absolute value of the difference ΔI, and the determining section 14 compares the absolute value of the difference ΔI and the standard value ΔIDD2. According to the result of this comparison, it is determined whether or not the semiconductor integrated circuit is a defective product.

Figure 7:
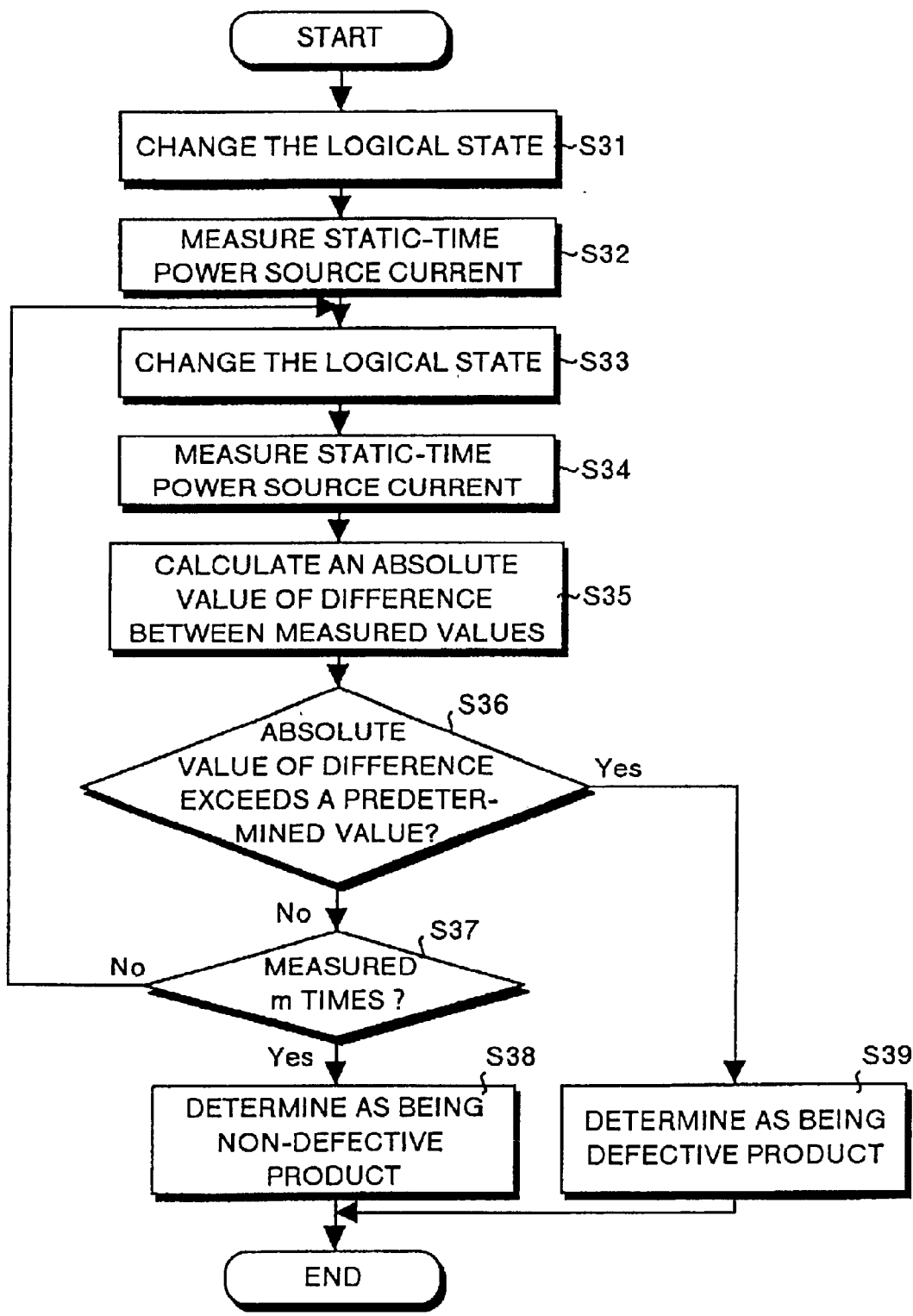
FIG. 7 illustrates a flow chart of a procedure of performing test processing with the use of the testing method of a semiconductor integrated circuit according to a third embodiment of the present invention.

Here, the testing procedure of testing a semiconductor integrated circuit according to the third embodiment will be explained with reference to a flow chart illustrated in FIG. 7. As shown in FIG. 7, by inputting the test pattern 5 containing a clock signal therein is input to the semiconductor integrated circuit 1 from the test pattern generating section 12 the setting of the logical state of the internal circuit of the semiconductor integrated circuit 1 (step S31) is changed. Then, the current value IDD of the static-time power source current is measured at the static time within one test period (step S32). Thereafter, the logical state of the internal circuit of the semiconductor integrated circuit 1 is further changed and set (step S33) and the current value IDD of the static-time power source current is measured at the static time within one test period (step S34).

Thereafter, an absolute value of the difference ΔI between the current values IDD that have been measured in the steps S32 and S34 is calculated (step S35). It is then determined whether or not the thus-calculated absolute value of the difference ΔI exceeds the predetermined standard value ΔIDD2 (step S36). When the absolute value of the difference ΔI exceeds the standard value ΔIDD2 (step S36, "YES") then it is determined that an unnecessary current path exists and, therefore, the semiconductor integrated circuit 1 is considered as a defective product (step S39). Then, this process ends.

On the other hand, if the absolute value of the difference ΔI does not exceed the standard value ΔIDD2 (step S36, "NO"), it is further determined whether or not current value measurements for m-time have been completed (step S37). When the m-time measurements have not been completed (step S37, "NO"), the processing shifts to the step S33, in which change of setting to the next logical state are further performed. The current value IDD in this logical state is measured. The absolute value of the difference ΔI between the current value IDD that has been measured in the immediately preceding step S34 and the current value IDD that has been measured in the present step S34 is calculated. Then, the absolute value of this difference ΔI and the standard value ΔIDD2 are again compared. When the absolute value of the difference ΔI does not exceed the standard value ΔIDD2 then the above-described processing is repeated.

On the contrary, if the m-time measurements have been completed (step S37, "YES"), it is determined that no unnecessary current path exists and, therefore, the semiconductor integrated circuit 1 is considered as a non-defective product (step S38). Then, this process ends.

According to the third embodiment, the same function and effect as those of the second embodiment are brought about. In addition, it is possible to immediately end the execution of the measurement and the determination based on the fact that the absolute value of the difference ΔI calculated during the measurement is greater than the standard value ΔIDD2. As a result, according to the third embodiment, it is possible to shorten the period of testing time.

Next, a fourth embodiment will be explained. In the first embodiment, the difference ΔImax between the maximum current value Imax and the minimum current value Imin of the m-time measured current values IDD is compared with the predetermined standard value ΔIDD, and it is determined whether or not the semiconductor integrated circuit is a defective product according to the result of this comparison. However, in the fourth embodiment, a standard deviation of the m-time measured current values IDD is obtained, and according to whether or not this standard deviation exceeds the standard value it is determined whether or not the semiconductor integrated circuit is a defective product.

The test of the semiconductor integrated circuit according to this fourth embodiment is performed by using the apparatus illustrated in FIG. 2. All of the clocks supplied by the test pattern 5, the times of the test periods, the m measuring times, and the measuring time of P(1)~P(m) are the same as those in the first embodiment. Namely, the results of the measurements of the current values IDD of the static-time power source current are completely the same as those in the first embodiment.

In the fourth embodiment, the standard deviation σ of the current values IDD is calculated from the measurement results of the current values IDD (I(1)~I(m)). Namely, $$\sigma = SQRT((1/m)(\Sigma(I(i) - Iave)^2))$$

is determined. It is to be noted that SQRT(x) represents the square root of the x; I (i) represents the current value that was measured the (i)th time; and Iave represents the average value of the measured current values I(1)~I(m). Also, the Σ represents the addition performed for i=1~m. This average value Iave can be determined as:

$$Iave = (1/m)(\Sigma I(i))$$

The determining section 14 compares the thus-determined standard deviation σ and a preset standard value σL that corresponds to the standard deviation. If $$\sigma < \sigma L,$$

it is determined that the semiconductor integrated circuit 1 is a non-defective product. If $$\sigma > \sigma L,$$

it is determined that the semiconductor intergrated circuit 1 is a defective product.

Figure 8:
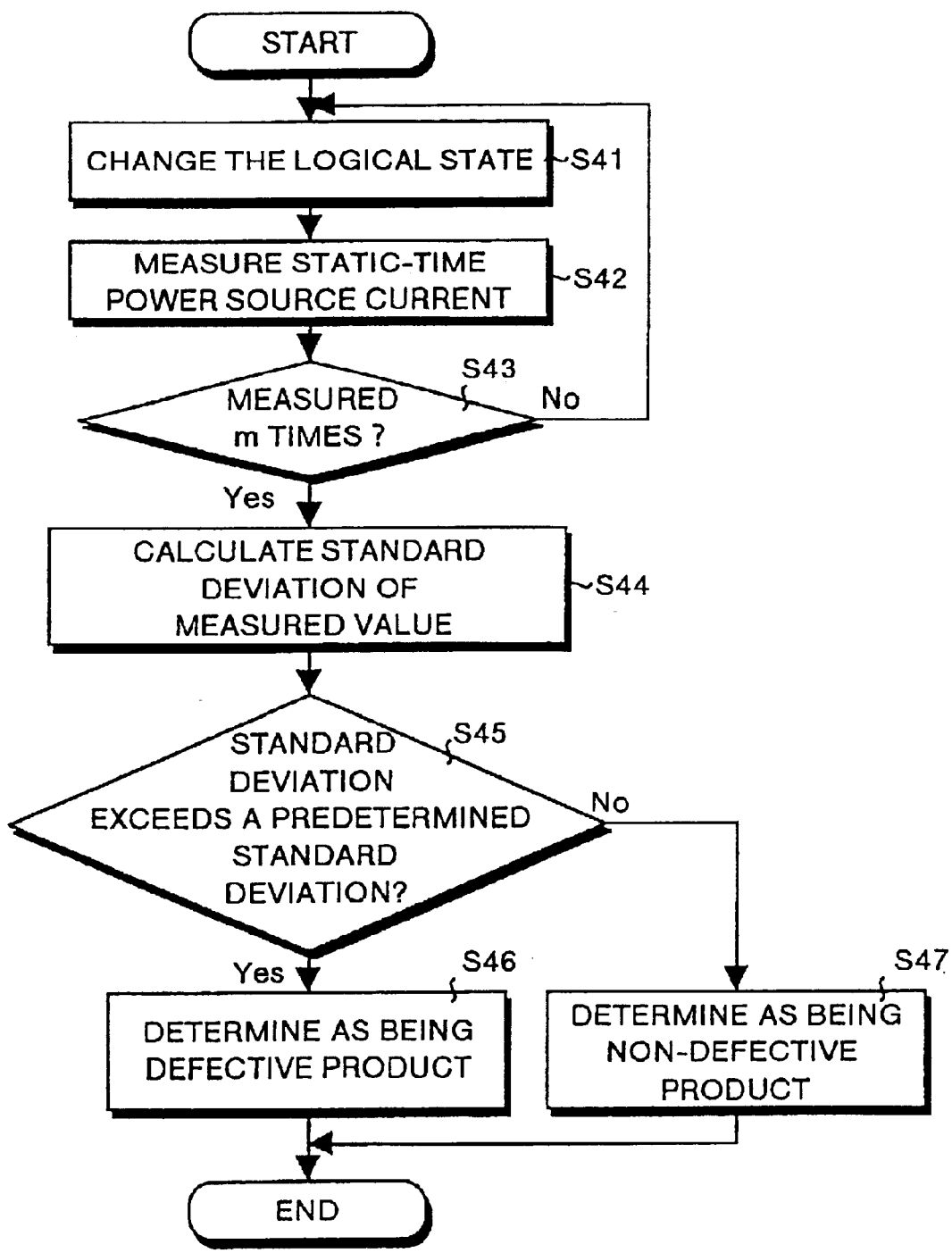
FIG. 8 illustrates a flow chart of a procedure of performing test processing with the use of the testing method of a semiconductor integrated circuit according to a fourth embodiment of the present invention.

Here, the testing procedure of testing a semiconductor integrated circuit according to the fourth embodiment will be explained with reference to a flow chart illustrated in FIG. 8. As shown in FIG. 8, by inputting the test pattern 5 containing a clock signal into the semiconductor integrated circuit 1 from the test pattern generating section 12 the setting of the logical state of the internal circuit of the semiconductor integrated circuit 1 (step S41) is changed. Then, the current value IDD of the static-time power source current is measured at the static time within one test period (step S42). Thereafter, it is determined whether or not the measurement of the current value IDD has been performed m times (step S43). If the measurement is not performed m times (step S43, "NO"), the processing is shifted step S41, whereby the above-described change of setting of the logical state and measurement of the current value of the static-time power source current are repeatedly performed.

On the other hand, when the measurement of the current value IDD has been performed m times (step S43, "YES"), the standard deviation a with respect to the current values IDD (I(1) to I(m)) that have been measured m times is calculated (step S44). Thereafter, it is determined whether or not the thus-calculated standard deviation a has exceeded the standard value σL (step S45). When the standard deviation a exceeds the standard value σL (step S45, "YES") then it is determined that an unnecessary current path exists and, therefore, the semiconductor integrated circuit 1 is considered as a defective product (step S46). When the standard deviation a does not exceed the standard value σL (step S45, "NO") then it is determined that an unnecessary current path does not exist and, therefore, the semiconductor integrated circuit 1 is considered as a non-defective product (step S47). Then, this process ends.

According to the fourth embodiment, a defect generated during the manufacturing process of a semiconductor can be detected when the current value Idd(tr) of the static-time power source current of one element such as a transistor that constitutes the semiconductor integrated circuit, and the dispersion ΔIdd(tr) of these current values Idd(tr) are large. In addition, a defect generated during the manufacturing process of a semiconductor can be detected by use of the current values IDD of the static-time power source current even in cases where the dispersion ΔIdd(IC) between the semiconductor integrated circuits due to the process parameters used in the manufacturing process of a semiconductor becomes large and the dispersion ΔIdd(IC) between the semiconductor integrated circuits is almost equal to the change of current ΔIdd (fault) due to the defect that has occurred during the manufacturing process of a semiconductor, or ΔIdd(IC) is larger than the current ΔIdd (fault) so that it is difficult to distinguish between this dispersion and the portion of change in current due to the unnecessary current path. Therefore, according the first embodiment, it is resultantly possible to reliably determine whether or not the semiconductor integrated circuit is a defective product.

Further, according to the fourth embodiment, even in a case where the current value IDD (static)(=Idd(tr)·N+ΔIdd (tr)·N) of the static-time power source current itself is largely dispersed between the semiconductor integrated circuits, it is possible to reliably detect the drawback that has occurred in the manufacturing process of a semiconductor. Therefore, according to the fourth embodiment, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Therefore, according to the fourth embodiment, it is resultantly possible to simplify the test program or the test vector.

Next, a fifth embodiment will be explained. In the first embodiment, the difference ΔImax between the maximum current value Imax and the minimum current value Imin of the m-time measured current values IDD is compared with the predetermined standard value ΔIDD, and it is determined whether or not the semiconductor integrated circuit is a defective product according to the result of this comparison. However, in the fifth embodiment, maximum, minimum and average of the m-time measured current values IDD is calculated, a first difference between the maximum and the average value and a second difference between the minimum current value and the average value is calculated, and when these first and second differences are both less than a preset standard value then it is determined that the semiconductor integrated circuit is a non-defective product.

The test of the semiconductor integrated circuit according to the fifth embodiment is performed by using the apparatus illustrated in FIG. 2. All of the clock supplied by the test pattern 5, the times of the test periods, the measuring times of m times, and the measuring time of P(1)~P(m) are the same as those in the first embodiment. Namely, the results of the measurements of the current values IDD of the static-time power source current are completely the same as those in the first embodiment.

In the fifth embodiment, the maximum current value Imax and the minimum current value Imin are extracted from the results of the measurements of these current values IDD (I(1)~I(m)). An average value Iave of the current values I(1)~I(m) is calculated. According to the measurement results illustrated in FIG. 1, the maximum current value Imax is a current value I(n), and the minimum current value Imin is a current value I(m−1). Then, the absolute value of the first difference ΔIDDmax, that is the difference between the maximum current value Imax and the average value Iave, is determined as:

$$|\Delta IDDmax|=Imax-Iave.$$

The absolute value of the second difference ΔIDDmin, that is the difference between the minimum current value Imin and the average value Iave, is determined as:

$$|\Delta IDDmin|=Imin-Iave$$

The determining section 14 then compares the thus-determined absolute value of the first difference ΔIDDmax and the standard value IDDL, and compares the thus-determined absolute value of the second difference ΔIDDmin and the standard value IDDL. And if $$|\Delta IDDmax| \leq IDDL, \text{ or } |\Delta IDDmin| \leq IDDL,$$

it is determined that the semiconductor integrated circuit 1 to be tested is a non-defective product. And if $$|\Delta IDDmax| > IDDL, \text{ or } |\Delta IDDmin| > IDDL,$$

it is determined that the semiconductor integrated circuit 1 to be tested is a defective product. It is to be noted that the standard value IDDL has a predetermined range.

Figure 9:
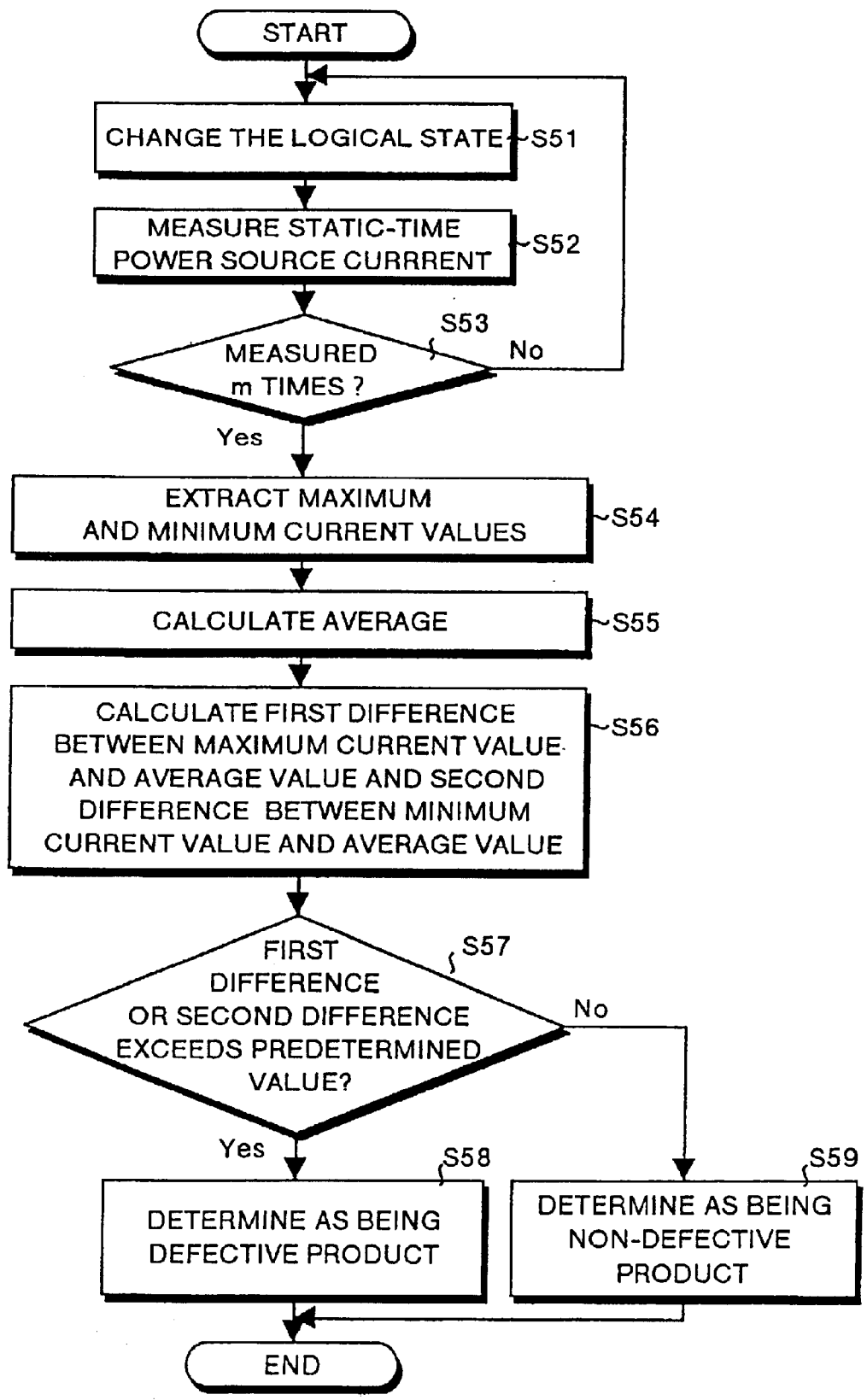
FIG. 9 illustrates a flow chart of a procedure of performing test processing with the use of the testing method of a semiconductor integrated circuit according to a fifth embodiment of the present invention.

Here, the testing procedure of testing a semiconductor integrated circuit according to the fifth embodiment will be explained with reference to a flow chart illustrated in FIG. 9. As shown in FIG. 9, by inputting the test pattern 5 containing a clock signal into the semiconductor integrated circuit 1 from the test pattern generating section 12 the setting of the logical state of the internal circuit of the semiconductor integrated circuit 1 (step S51) is changed. Then, the current value IDD of the static-time power source current is measured at the static time within one test period (step S52). Thereafter, it is determined whether or not the measurement of the current value IDD has been performed m times (step S53). When the measurement is not performed m times (step S53, "NO"), the processing is shifted step S51, whereby the above-described change of setting of the logical state and measurement of the current value of the static-time power source current are repeatedly performed.

On the other hand, when the measurement of the current value IDD has been performed m times (step S53, "YES"), the maximum current value Imax and the minimum current value Imin are extracted from among the m-time measured current values IDD (I(1)~I(m)) (step S54). Further, the average value Iave of the current values IDD is calculated (step S55). Further, the first difference ΔIDDmax that is the difference between the maximum current value IDDmax and the average value Iave, and the second difference ΔIDDmin that is the difference between the minimum current value IDDmin and the average value Iave, are calculated (step S56).

Thereafter, it is determined whether or not the thus-calculated absolute value of the first difference ΔIDDmax or the thus-calculated absolute value of the second difference ΔIDDmin has exceeded the standard value IDDL (step S57). When either one of them exceeds the standard value (step S57, "YES"), it is determined that an unnecessary current path exists and, therefore, the semiconductor integrated circuit 1 is considered as a defective product (step S58). When neither the first difference ΔIDDmax or the second difference ΔIDDmin exceeds the standard value IDDL (step S58, "NO") then it is determined that an unnecessary current path does not exist and, therefore, the semiconductor integrated circuit 1 is considered as a non-defective product (step S59). Then, this process ends.

According to this fifth embodiment, the same function and effect as those of the first embodiment are brought about. Simultaneously, even in a case where the measurement results exhibit a gradient (a deflection) with the lapse of time, because of, for example, a rise in temperature of the semiconductor integrated circuit 1 itself due to a plurality of measurements of the current value, it is possible to mitigate the effect of this gradient and thereby perform the determination processing with a high precision.

Next, a sixth embodiment will be explained. In the first embodiment, the difference ΔImax between the maximum current value Imax and the minimum current value Imin of the m-time measured current values IDD is compared with the predetermined standard value ΔIDD, and it is determined whether or not the semiconductor integrated circuit is a defective product according to the result of this comparison. However, in the sixth embodiment, after having performed m-time measurements of the current value IDD, the first-measured current value IDD is measured once more, and if there is no difference between the two values then a determination processing is performed in the same way as in the first embodiment.

The test of the semiconductor integrated circuit according to this sixth embodiment is performed by using the apparatus illustrated in FIG. 2. All of the clock supplied by the test pattern 5, the times of the test periods, the measuring times of m times, and the measuring time of P(1)~P(m) are the same as those in the first embodiment. Namely, the results of the measurements of the current values IDD of the static-time power source current are completely the same as those in the first embodiment.

Figure 10:
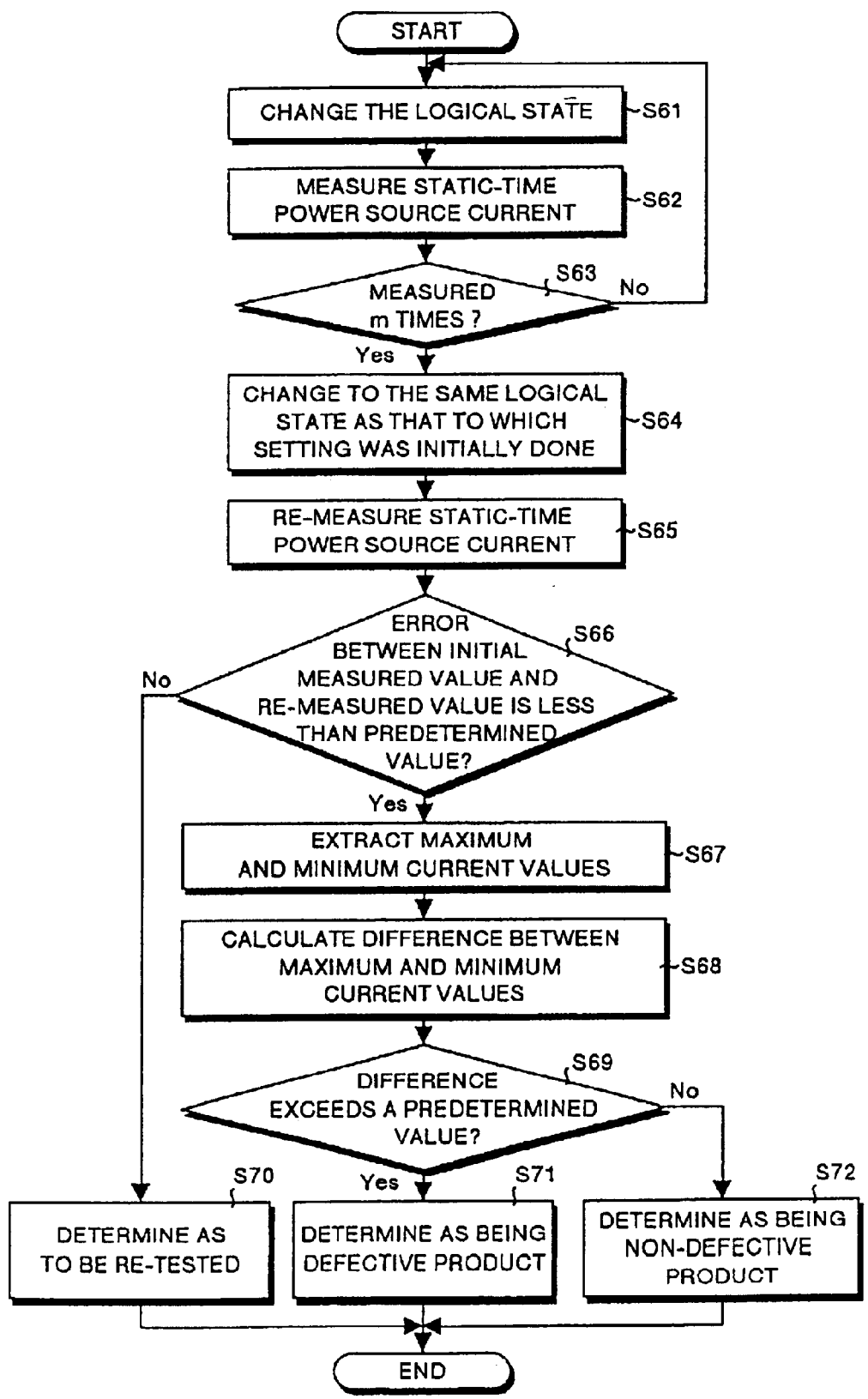
FIG. 10 illustrates a flow chart of a procedure of performing test processing with the use of the testing method of a semiconductor integrated circuit according to a sixth embodiment of the present invention.
Figure 11:
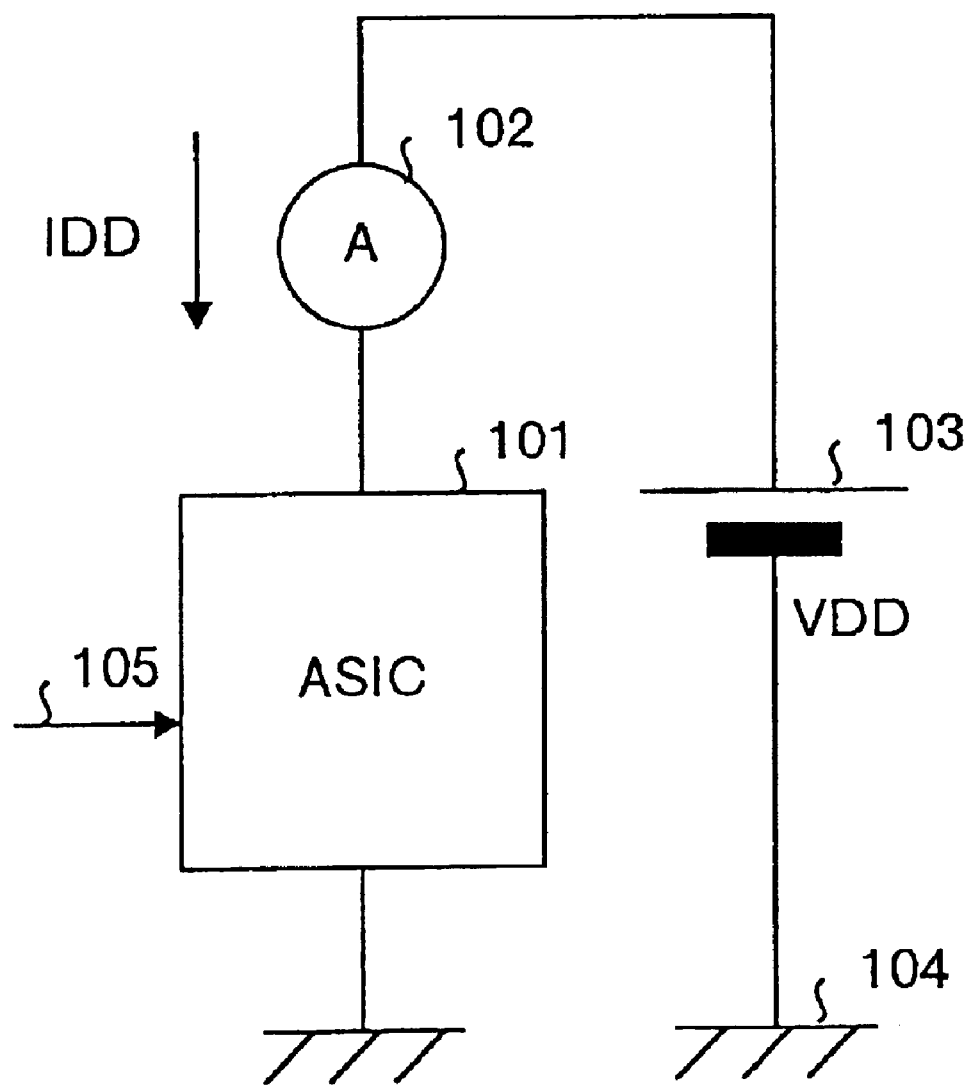
FIG. 11 illustrates in block diagram form an example of the construction of an apparatus for executing a testing method of a semiconductor integrated circuit.

Here, the testing procedure of testing a semiconductor integrated circuit according to the sixth embodiment will be explained with reference to a flow chart illustrated in FIG. 10. As shown in FIG. 10, by inputting the test pattern 5 containing a clock signal into the semiconductor integrated circuit 1 from the test pattern generating section 12 the setting of the logical state of the internal circuit of the semiconductor integrated circuit 1 (step S61) is changed. Then, the current value IDD of the static-time power source current is measured at the static time within one test period (step S62). Thereafter, it is determined whether or not the measurement of the current value IDD has been performed m times (step S63). When the measurement is not performed m times (step S63, "NO"), the processing shifts to the step S61, whereby the above-described change of setting of the logical state and measurement of the current value of the static-time power source current are repeatedly performed.

On the other hand, when the measurement of the current value IDD has been performed m times (step S63, "YES"), setting is changed to the same logical state as that which was set first (step S64). Then, the current value I(R) at the static time is measured once more after the logical state is released (step S65). Thereafter, it is determined whether or not the error between the first current value I(1) and the re-measured current value I(R) falls within a predetermined range (step S66). When the error does not fall within the predetermined range it indicates that the measurement result is not reliable so that it is determined that a re-test is required (step S70). Then, this process ends.

On the contrary, when the error falls within the predetermined range it indicates that the measurement result is reliable and hence the same processing as in the steps S14~S18 of the first embodiment is performed. Namely, the maximum current value Imax and the minimum current value Imin are extracted from among the m-time measured current values IDD (I(1)~I(m)) (step S67). The difference $\Delta$Imax between the thus-calculated maximum current value Imax and the minimum current value Imin is calculated (step S68).

Thereafter, it is determined whether or not the thus-calculated difference $\Delta$Imax has exceeded the standard value $\Delta$IDD (step S69). When the difference $\Delta$Imax exceeds the standard value $\Delta$IDD (step S69, "YES") then it is determined that an unnecessary current path exists and, therefore, the semiconductor integrated circuit 1 is considered as a defective product (step S71). When the difference $\Delta$Imax does not exceed the standard value $\Delta$IDD (step S69, "NO") then it is determined that an unnecessary current path does not exist and, therefore, the semiconductor integrated circuit 1 is considered as a non-defective product (step S72). Then, this process ends.

According to the sixth embodiment, the same function and effect as those in the first embodiment are brought about. When the room temperature changes, the testing environment such as the abnormality of the IC tester changes, or the temperature of the semiconductor integrated circuit itself rises due to the leakage of the current etc. during the operation of the semiconductor integrated circuit then the current value of the static-time power source current sometimes changes regardless of the existence or non-existence of an unnecessary current path in the semiconductor integrated circuit. According to the sixth embodiment, it is possible to prevent an erroneous determination from occurring under such conditions.

Further, as occurrence of an erroneous determination can be prevented, it is possible to obtain an accurate measurement result of the static-time power source current. Therefore, it is possible to enhance the quality of a large-scaled CMOSIC in the sub-micron process and also to prevent the decrease in the yield due to the erroneous determination. It is to be noted that although in this sixth embodiment the explanation thereof has been made as a form of embodiment corresponding to the first embodiment, this sixth embodiment can be also be applied to the second, third, fourth and fifth embodiments.

According to the testing method of semiconductor integrated circuit of the first aspect, a current value of a static-time power source current passing through a plurality of elements that constitute a semiconductor integrated circuit is measured for a plurality of times while sequentially changing and setting a logical state of the plurality of elements, maximum and minimum values are of the current values are extracted, and when the difference between the maximum and the minimum values exceeds a predetermined value then it is determined that the semiconductor integrated circuit is a defective product. Therefore, a defect generated during the manufacturing process of a semiconductor can be detected when the current value of the static-time power source current of one element such as a transistor that constitutes the semiconductor integrated circuit, and the dispersion of these current values are large. In addition, a defect generated during the manufacturing process of a semiconductor can also be detected by use of the current values of the static-time power source current even in cases where the dispersion between the semiconductor integrated circuits due to the process parameters used in the manufacturing process of a semiconductor becomes large and the dispersion between the semiconductor integrated circuits is almost equal to the change of current due to the defect that has occurred during the manufacturing process of a semiconductor, or dispersion is larger than the change of current so that it is difficult to distinguish between this dispersion and the portion of change in current due to the unnecessary current path. Resultantly it is possible to reliably determine whether or not the semiconductor integrated circuit is a defective product.

Further, even when the static-time power source current itself is largely dispersed between a plurality of semiconductor integrated circuits, it is possible to reliably detect the drawback that has occurred in the manufacturing process of a semiconductor. Therefore, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Resultantly it is possible to simplify the test program or the test vector.

According to the testing method of semiconductor integrated circuit of the second aspect, a current value of a static-time power source current passing through a plurality of elements that constitute a semiconductor integrated circuit is measured for a plurality of times while changing and setting a logical state of the plurality of elements, a difference between the successively measured current values with respect to a plurality of current values that have been measured is calculated, when at least one of the calculated difference exceeds a predetermined value then it is determined that the semiconductor integrated circuit is a defective product. Therefore, a defect generated during the manufacturing process of a semiconductor can be detected when the current value of the static-time power source current of one element such as a transistor that constitutes the semiconductor integrated circuit, and the dispersion of these current values are large. In addition, a defect generated during the manufacturing process of a semiconductor can also be detected by use of the current values of the static-time power source current even in cases where the dispersion between the semiconductor integrated circuits due to the process parameters used in the manufacturing process of a semiconductor becomes large and the dispersion between the semiconductor integrated circuits is almost equal to the change of current due to the defect that has occurred during the manufacturing process of a semiconductor, or dispersion is larger than the change of current so that it is difficult to distinguish between this dispersion and the portion of change in current due to the unnecessary current path. Resultantly it is possible to reliably determine whether or not the semiconductor integrated circuit is a defective product.

Further, even when the static-time power source current itself is largely dispersed between a plurality of semiconductor integrated circuits, it is possible to reliably detect the drawback that has occurred in the manufacturing process of a semiconductor. Therefore, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Resultantly it is possible to simplify the test program or the test vector.

According to the testing method of semiconductor integrated circuit of the third aspect, a current value of a static-time power source current passing through a plurality of elements that constitute a semiconductor integrated circuit is measured in a first measuring step while changing and setting a logical state of the plurality of elements, a current value of the static-time power source current passing through the plurality of elements that constitute the semiconductor integrated circuit is measured in a second measuring step while changing and setting a logical state of the plurality of elements set in the first measuring step, a difference between the current values measured in the first and second measuring steps is calculated, when the calculated difference exceeds a predetermined value then it is determined that the semiconductor integrated circuit is a defective product. Further, when it is determined that the semiconductor integrated circuit is a non-defective product then the current value obtained in the second measuring step is replaced with the current value obtained in the first measuring step and the second measuring step, the calculation of difference and the determination of defectiveness is repeated for a predetermined number of times. Therefore, a defect generated during the manufacturing process of a semiconductor can be detected when the current value of the static-time power source current of one element such as a transistor that constitutes the semiconductor integrated circuit, and the dispersion of these current values are large. In addition, a defect generated during the manufacturing process of a semiconductor can also be detected by use of the current values of the static-time power source current even in cases where the dispersion between the semiconductor integrated circuits due to the process parameters used in the manufacturing process of a semiconductor becomes large and the dispersion between the semiconductor integrated circuits is almost equal to the change of current due to the defect that has occurred during the manufacturing process of a semiconductor, or dispersion is larger than the change of current so that it is difficult to distinguish between this dispersion and the portion of change in current due to the unnecessary current path. Resultantly it is possible to reliably determine whether or not the semiconductor integrated circuit is a defective product.

Further, even when the static-time power source current itself is largely dispersed between a plurality of semiconductor integrated circuits, it is possible to reliably detect the drawback that has occurred in the manufacturing process of a semiconductor. Therefore, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Resultantly it is possible to simplify the test program or the test vector.

Further, it is possible to immediately end the execution of the measurement and the determination based on the fact that the difference calculated during the measurement is greater than a predetermined value. Resultantly it is possible to shorten the period of testing time.

According to the testing method of semiconductor integrated circuit of the fourth aspect, a current value of a static-time power source current passing through a plurality of elements that constitute a semiconductor integrated circuit is measured for a plurality of times while sequentially changing and setting a logical state of the plurality of elements, a standard deviation of the plurality of the measured current values is calculated, when the standard deviation exceeds a predetermined value it is determined that the semiconductor integrated circuit is a defective product. Therefore, a defect generated during the manufacturing process of a semiconductor can be detected when the current value of the static-time power source current of one element such as a transistor that constitutes the semiconductor integrated circuit, and the dispersion of these current values are large. In addition, a defect generated during the manufacturing process of a semiconductor can also be detected by use of the current values of the static-time power source current even in cases where the dispersion between the semiconductor integrated circuits due to the process parameters used in the manufacturing process of a semiconductor becomes large and the dispersion between the semiconductor integrated circuits is almost equal to the change of current due to the defect that has occurred during the manufacturing process of a semiconductor, or dispersion is larger than the change of current so that it is difficult to distinguish between this dispersion and the portion of change in current due to the unnecessary current path. Resultantly it is possible to reliably determine whether or not the semiconductor integrated circuit is a defective product.

Further, even when the static-time power source current itself is largely dispersed between a plurality of semiconductor integrated circuits, it is possible to reliably detect the drawback that has occurred in the manufacturing process of a semiconductor. Therefore, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Resultantly it is possible to simplify the test program or the test vector.

According to the testing method of semiconductor integrated circuit of the fifth aspect, a current value of a static-time power source current passing through a plurality of elements that constitute a semiconductor integrated circuit is measured for a plurality of times while sequentially changing and setting a logical state of the plurality of elements, maximum and minimum values are extracted from the measured current values, an average of the measured current values is calculated, when a difference between the average and the maximum value and a difference between the average and the minimum value exceeds a predetermined value then it is determined that the semiconductor integrated circuit is a defective product. Therefore, a defect generated during the manufacturing process of a semiconductor can be detected when the current value of the static-time power source current of one element such as a transistor that constitutes the semiconductor integrated circuit, and the dispersion of these current values are large. In addition, a defect generated during the manufacturing process of a semiconductor can also be detected by use of the current values of the static-time power source current even in cases where the dispersion between the semiconductor integrated circuits due to the process parameters used in the manufacturing process of a semiconductor becomes large and the dispersion between the semiconductor integrated circuits is almost equal to the change of current due to the defect that has occurred during the manufacturing process of a semiconductor, or dispersion is larger than the change of current so that it is difficult to distinguish between this dispersion and the portion of change in current due to the unnecessary current path. Resultantly it is possible to reliably determine whether or not the semiconductor integrated circuit is a defective product.

Further, even when the static-time power source current itself is largely dispersed between a plurality of semiconductor integrated circuits, it is possible to reliably detect the drawback that has occurred in the manufacturing process of a semiconductor. Therefore, it is possible to remarkably enhance the quality of a large-in-scale and with-high-speed highly integrated CMOSIC that has been so integrated in the sub-micron process that uses an ultra micro-structural technique. In addition, since in the determination of such drawback it is arranged to use the measurement result of the current value of the static-time power source current, additional preparation of the test pattern becomes unnecessary. Resultantly it is possible to simplify the test program or the test vector.

Further, even in a case where the measurement results exhibit a gradient (a deflection) with the lapse of time, because of, for example, a rise in temperature of the semiconductor integrated circuit itself due to a plurality of measurements of the current value, it is possible to mitigate the effect of this gradient and thereby perform the determination processing with a high precision.

According to the testing method of semiconductor integrated circuit of the sixth aspect, a logical state of the elements is set to an initial state, the current value of a static-time power source current is measured, when the difference between the current value at the time of initial logical state and the current value after re-setting is greater than a predetermined value then it is determined that the semiconductor integrated circuit is a non-defective product. Therefore, even if the current value of the static-time power source current sometimes changes regardless of the existence or non-existence of an unnecessary current path in the semiconductor integrated circuit due to a change in the room temperature, a change in the testing environment such as the abnormality of the IC tester changes, or rise in the temperature of the semiconductor integrated circuit itself due to the leakage of the current etc. during the operation of the semiconductor integrated circuit, it is possible to prevent an erroneous determination from occurring under such conditions.

Further, as occurrence of an erroneous determination can be prevented, it is possible to obtain an accurate measurement result of the static-time power source current. Therefore, it is possible to enhance the quality of a large-scaled CMOSIC in the sub-micron process and also to prevent the decrease in the yield due to the erroneous determination.

According to the apparatus for testing a semiconductor integrated circuit of the seventh aspect, a measuring unit measures a current value of a static-time power source current passing through a plurality of elements that constitute a semiconductor integrated circuit for a plurality of times while sequentially changing and setting a logical state of the plurality of elements. Further, an extracting unit extracts maximum and minimum values from the plurality of the current values that have been measured. Further, a determining unit determines that the semiconductor integrated circuit is a defective product when the difference between the maximum and the minimum values exceeds a predetermined value. Therefore, a defect generated during the manufacturing process of a semiconductor can be detected when the current value of the static-time power source current of one element such as a transistor that constitutes the semiconductor integrated circuit, and the dispersion of these current values are large. In addition, a defect generated during the manufacturing process of a semiconductor can also be detected by use of the current values of the static-time power source current even in cases where the dispersion between the semiconductor integrated circuits due to the process parameters used in the manufacturing process of a semiconductor becomes large and the dispersion between the semiconductor integrated circuits is almost equal to the change of current due to the defect that has occurred during the manufacturing process of a semiconductor, or dispersion is larger than the change of current so that it is difficult to distinguish between this dispersion and the portion of change in current due to the unnecessary current path. Resultantly it is possible to reliably determine whether or not the semiconductor integrated circuit is a defective product.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of testing a semiconductor integrated circuit comprising:

supplying an input signal to a logic circuit of a semiconductor integrated circuit;

repeatedly measuring a current from a static-time power source passing through a plurality of elements that constitute the semiconductor integrated circuit while sequentially changing and setting a logical state of the plurality of elements;

calculating a standard deviation of the plurality of currents that have been measured; and determining that the semiconductor integrated circuit is defective when the standard deviation exceeds a first threshold value.

2. The method according to claim 1, further comprising:

re-setting to an initial logical state set before first measuring the current and re-measuring the current from the static-time power source in the initial logical state; and determining that the semiconductor integrated circuit is non-defective when a difference between the current in the initial logical state and the current in re-measuring is less than a second threshold value.

* * * * *